(12) United States Patent
Inoue et al.

(10) Patent No.: US 7,573,178 B2
(45) Date of Patent: Aug. 11, 2009

(54) ACOUSTIC WAVE DEVICE, RESONATOR AND FILTER

(75) Inventors: Shogo Inoue, Kawasaki (JP); Hiroyoshi Yasuda, Kawasaki (JP); Michio Miura, Kawasaki (JP); Satoru Matsuda, Kawasaki (JP); Takashi Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/898,474

(22) Filed: Sep. 12, 2007

(65) Prior Publication Data

US 2008/0067896 A1    Mar. 20, 2008

(30) Foreign Application Priority Data

Sep. 13, 2006    (JP)    ............................... 2006-248030

(51) Int. Cl.
*H01L 41/08*    (2006.01)
(52) U.S. Cl. .................... 310/313 R; 333/187
(58) Field of Classification Search ............... 310/313; 333/187–195
See application file for complete search history.

(56) References Cited

U.S. PATENT DOCUMENTS

| 4,350,916 | A  | * | 9/1982  | August et al. ........... 310/313 B |
| 6,046,656 | A  | * | 4/2000  | Mishima ................. 310/313 R |
| 7,310,027 | B2 | * | 12/2007 | Kando ........................ 333/193 |
| 2004/0207490 | A1 | * | 10/2004 | Jun et al. ..................... 333/187 |
| 2005/0099091 | A1 | * | 5/2005  | Mishima et al. ......... 310/313 R |
| 2006/0158800 | A1 | * | 7/2006  | Takayama et al. ............. 361/56 |
| 2006/0164184 | A1 | * | 7/2006  | Nakamura et al. .......... 333/195 |
| 2007/0241637 | A1 | * | 10/2007 | Kalantar-Zadeh ....... 310/313 D |
| 2008/0129418 | A1 | * | 6/2008  | Miura et al. ................ 333/195 |

FOREIGN PATENT DOCUMENTS

JP    10278336 A    * 10/1998
WO    WO98/52279    11/1998

OTHER PUBLICATIONS

Masatsune Yamaguchi, Takashi Yamashita, Ken-Ya Hashimoto and Tatsuya Omori, "HighlyPiezoelectric Boundary Waves in Si/SiO$_2$/LiNbO$_2$ Structure," Proceeding of 1998 IEEE International Frequency Control Symposium, U.S.A., IEEE, 1998, pp. 484-488.

* cited by examiner

*Primary Examiner*—Jaydi SanMartin
(74) *Attorney, Agent, or Firm*—Arent Fox LLP

(57) ABSTRACT

An acoustic wave device includes a piezoelectric substrate, comb electrodes formed above the piezoelectric substrate, and a first dielectric film provided so as to cover the comb electrodes, the first dielectric film having empty spaces associated with fingers of the comb electrodes.

20 Claims, 26 Drawing Sheets

US 7,573,178 B2

ACOUSTIC WAVE DEVICE, RESONATOR AND FILTER

BACKGROUND OF THE INVENTION

1. Field of the Invention

The present invention relates to acoustic wave devices, resonators and filters, and more particularly, to an acoustic wave filter having a dielectric film that covers comb electrodes, and a resonator and a filter using the acoustic wave filter.

2. Description of the Related Art

A filer using an acoustic wave is used in high-frequency radio equipment such as a cellular phone. An exemplary acoustic wave is a surface acoustic wave (SAW). FIG. 1 is a plan view of a SAW resonator, and FIG. 1B is a cross-sectional view taken along a line A-A' shown in FIG. 1. FIG. 1A shows a smaller number of fingers of an electrode 12 than an actual number for the sake of simplicity. The electrode 12 is formed on a piezoelectric substrate 10, which may be a lithium tantalate ($LiTaO_3$) substrate or a lithium niobate ($LiNbO_3$) substrate. The electrode 12 may be made of an aluminum alloy, a copper alloy or gold. The electrode 12 includes a pair of comb electrodes IDT0 and a pair of reflection electrodes R0. The pair of comb electrodes IDT0 forms an interdigital transducer. The reflection electrodes R0 include grating electrodes. The pair IDT0 of comb electrodes is provided between the reflection electrodes R0. When a high-frequency signal is applied to one of the pair IDT0 of comb electrodes, a surface acoustic wave is excited on the surface of the piezoelectric substrate 10. The SAW is resonated at a frequency that depends on the period λ of the electrode fingers of the pair IDT0 of comb electrodes and the propagation velocity of the SAW. A high-frequency signal of the resonance frequency is developed at the other comb electrode of IDT0. Thus, the device shown in FIGS. 1A and 1B functions as a resonator.

In practice, the SAW device is required to have a reduced absolute value of a temperature coefficient of frequency (frequently abbreviated as TCF). TCF is a rate of change of the frequency response to a variation in the environment temperature. In the resonators, a change of the resonance frequency to a variation in the environment temperature equal to 1° C. is expressed in the unit of ppm/° C. TCF almost depends on the temperature coefficient of velocity of SAW propagated on the surface of the piezoelectric substrate. The TCF of the SAW device is as bad as −80~−40 ppm/° C. for a piezoelectric substrate of LiNbO3 or LiTaO3, and is thus required to be improved.

The following documents disclose techniques directed to improving the TCF of SAW devices: International Publication No. WO98/52279 (hereinafter referred to as D1), and Masatsune Yamaguchi, Takashi Yamashita, Ken-ya Hashimoto, Tatsuya Omori, "Highly Piezoelectric Boundary Waves in Si/$SiO_2$/$LiNbO_3$ structure", Proceeding of 1998 IEEE International Frequency Control Symposium, IEEE, 1998, pp. 484-488. Referring to FIG. 2, the electrode 12 is covered with a first dielectric film 14, which may be made of silicon oxide and may be as thick as 0.2λ to 0.4λ. An acoustic wave called Love wave is excited in the acoustic wave device shown in FIG. 2. The Love wave has changes in both the piezoelectric substrate 10 and the first dielectric film 14. Referring to FIG. 3, a third dielectric film 16, which may be made of aluminum oxide, is provided on the first dielectric film 14. The acoustic wave device shown in FIG. 3 has an excited acoustic wave called boundary wave having changes in both the piezoelectric substrate 10 and the first dielectric film 14. In the SAW devices shown in FIGS. 2 and 3, the acoustic wave is propagated in not only the piezoelectric substrate 10 but also the first dielectric film 14. The temperature coefficient of propagation velocity of the acoustic wave propagated in the first dielectric film 14 is designed to have a sign opposite to that of the temperature coefficient of propagation velocity of the acoustic wave propagated in the piezoelectric substrate 10. When the thickness of the first dielectric film 14 is optimally selected, the total propagation velocity of acoustic wave can be kept almost constant. That is, TCF can be reduced by optimally selecting the thickness of the first dielectric film 14.

However, the acoustic wave devices shown in FIGS. 2 and 3 has a problem that the mechanical resonance sharpness Qm of the first dielectric film 14 is considerably smaller than that of the piezoelectric substrate 10. Thus, loss is caused in the acoustic wave propagated in the first dielectric film 14, so that the acoustic wave device has a large loss.

SUMMARY OF THE INVENTION

The present invention has been made in view of the above circumstances, and provides an acoustic wave device having an improved temperature coefficient of frequency and an improved loss.

According to an aspect of the present invention, there is provided an acoustic wave device including: a piezoelectric substrate; comb electrodes formed above the piezoelectric substrate; and a first dielectric film provided so as to cover the comb electrodes, the first dielectric film having empty spaces associated with fingers of the comb electrodes.

According to another aspect of the present invention, there are provided a resonator and a filter using the above acoustic wave device.

BRIEF DESCRIPTION OF THE DRAWINGS

Embodiments of the present invention will be described with reference to the following figures, in which.

DESCRIPTION OF THE PREFERRED EMBODIMENTS

A description will now be given of preferred embodiments of the present invention in conjunction with the accompanying drawings.

First Embodiment

Figure 4A:
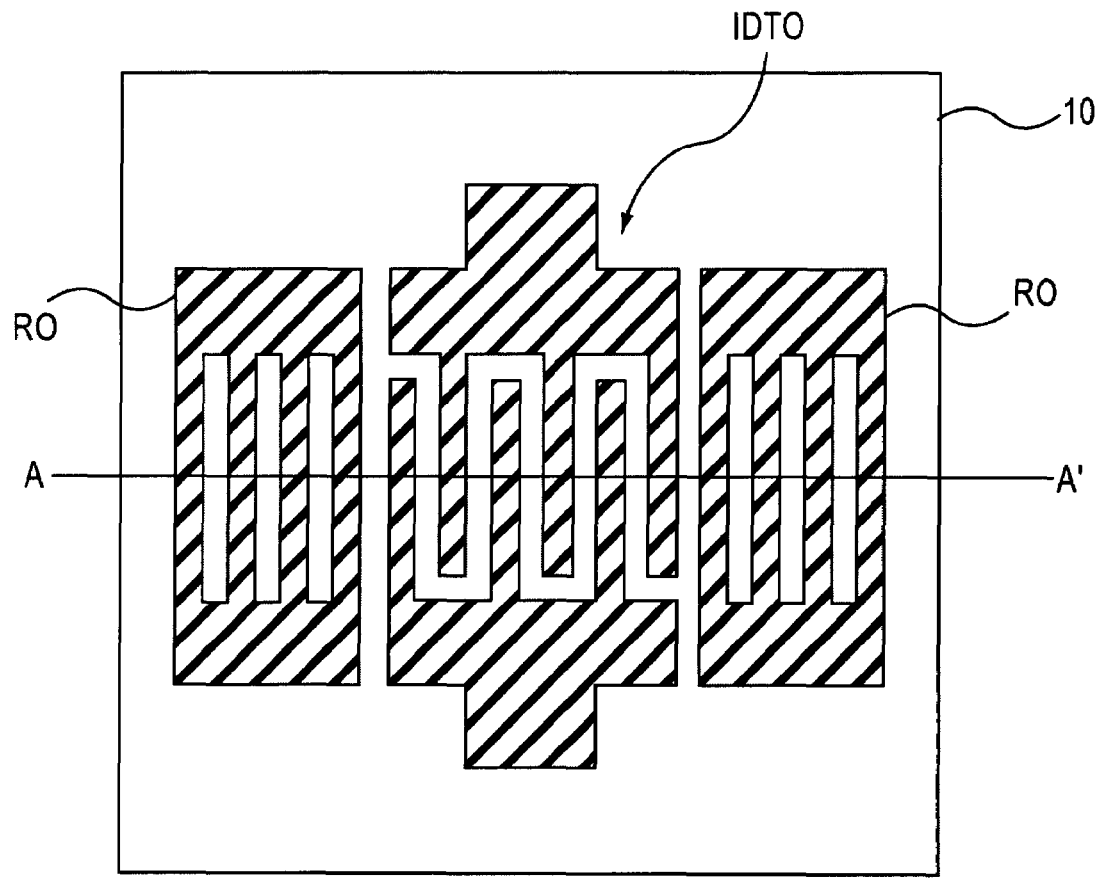
FIG. 4A is a plan view of an acoustic wave device in accordance with a first embodiment.
Figure 4B:
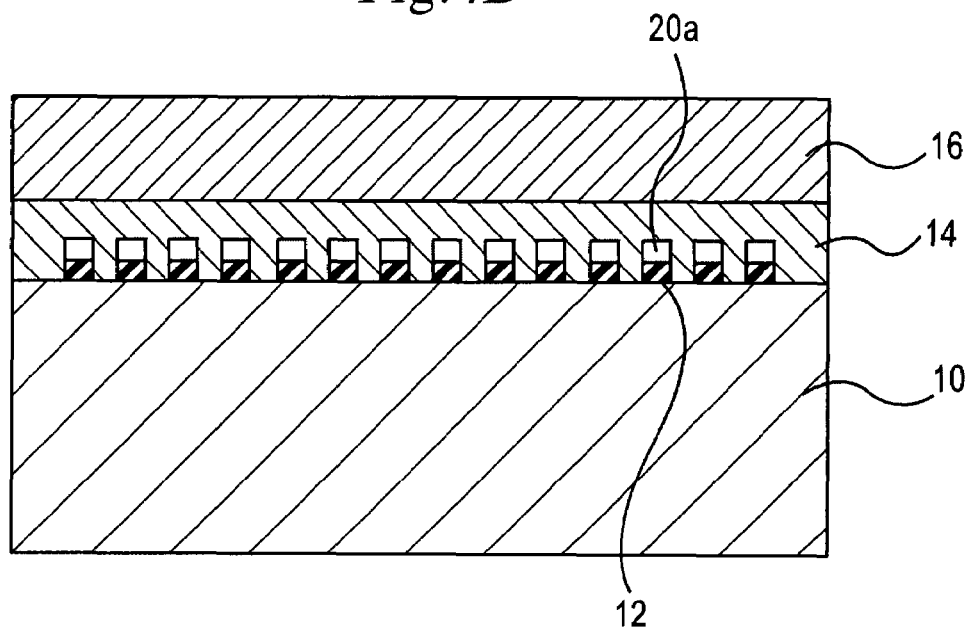
FIG. 4B is a cross-sectional view taken along a line A-A' shown in FIG. 4A.

FIG. 4A is a plan view pf an acoustic wave device according to a first embodiment of the present invention, and FIG. 4B is a cross-sectional view taken along a line A-A' shown in FIG. 4A. The electrode 12 is provided above, more specifically, provided on the piezoelectric substrate 10, which may, for example, be made of $LiNbO_3$ or $LiTaO_3$. The electrode 12 may, for example, be made of copper. The electrode 12 includes the pair of comb electrodes IDT0 and the pair of reflection electrodes R0 provided at both sides of the pair IDT0 in the propagation direction of the acoustic wave. The comb electrodes IDT0 have a plurality of electrode fingers, and have a cross-section shown in FIG. 4B. The first dielectric film 14 made of silicon oxide is provided so as to cover the electrode 12. The third dielectric film 16 made of aluminum oxide is provided on the third dielectric film 14. The first dielectric film 14 has empty spaces 20a associated with the electrode 12. The empty spaces 20a in the first dielectric film 14 are provided so as to contact the upper surfaces of the fingers of the electrode 12. The empty spaces 20a are located above, more specifically, located on the electrode 12. A sacrificing layer may be used to form the empty spaces.

Figure 5:
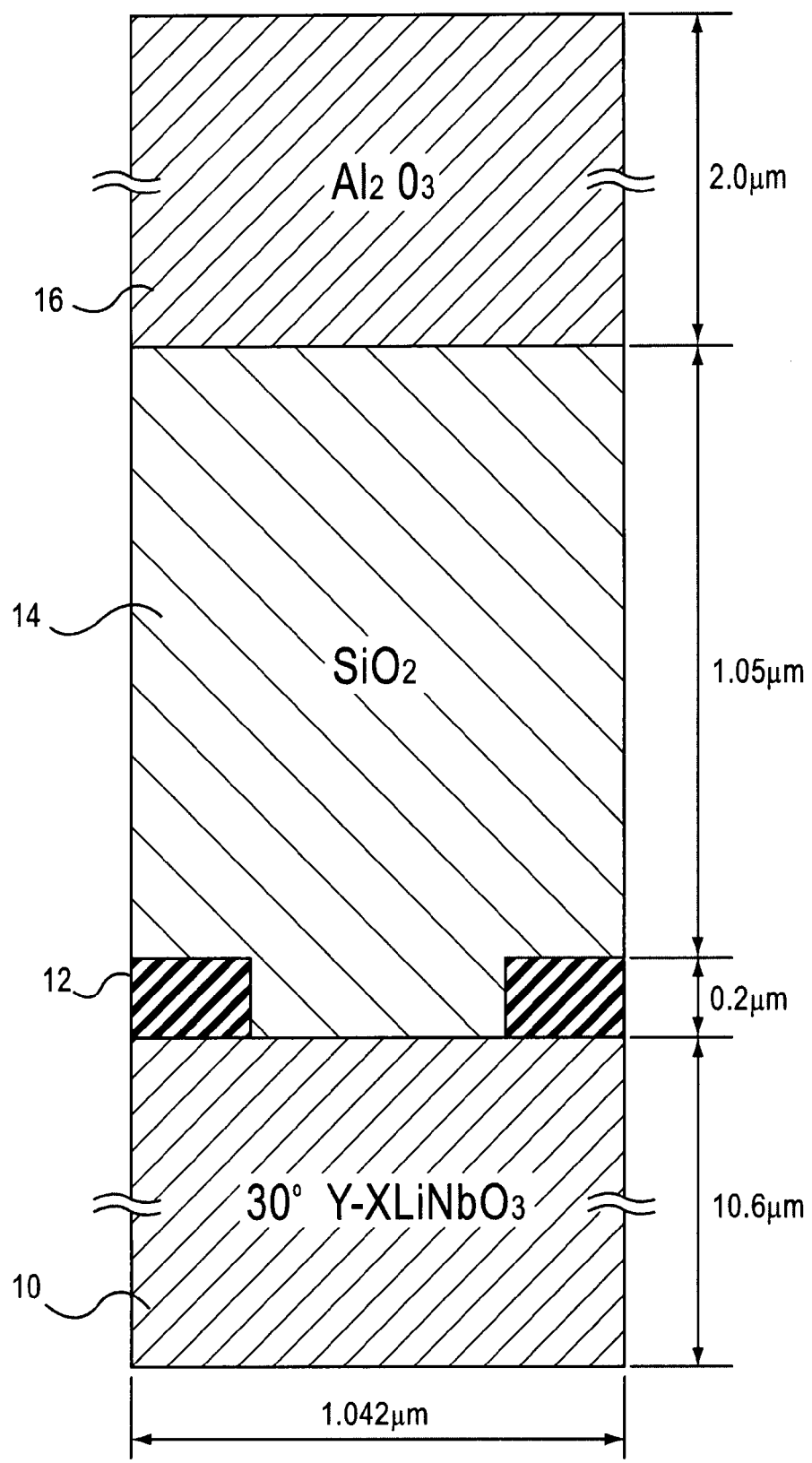
FIG. 5 shows a structure used in simulation for an acoustic wave device of a first comparative example.

The inventors obtained the magnitude of insertion loss of the resonator according to the first embodiment by simulation. FIG. 5 shows a structure used in a simulation for a first comparative example in which the dielectric film 14 does not have any empty spaces on the electrode 12. In the simulation, only a 0.5 pair of comb electrodes in a two-dimensional model having an acoustic wave propagating direction and a substrate depth direction was extracted and the frequency response thereof was measured. The period λ of the electrode fingers of the comb electrodes was set equal to 2.084 μm. That is, the width of the 0.5 pair was 1.042 μm. The piezoelectric substrate 10 was made of 30° Y-cut X-propagation $LiNbO_3$ and was 10.6 μm thick. The electrode 12 was made of copper and was 0.2 μm thick. The first dielectric film 14 was made of silicon oxide ($SiO_2$) and was 1.05 μm thick. The third dielectric film 16 was made of aluminum oxide ($Al_2O_3$) and was 2.0 μm thick. The mechanical resonance sharpness Qm of the oxide silicon film was set equal to 50, and Qm of the other materials was set equal to 1000.

Figure 6:
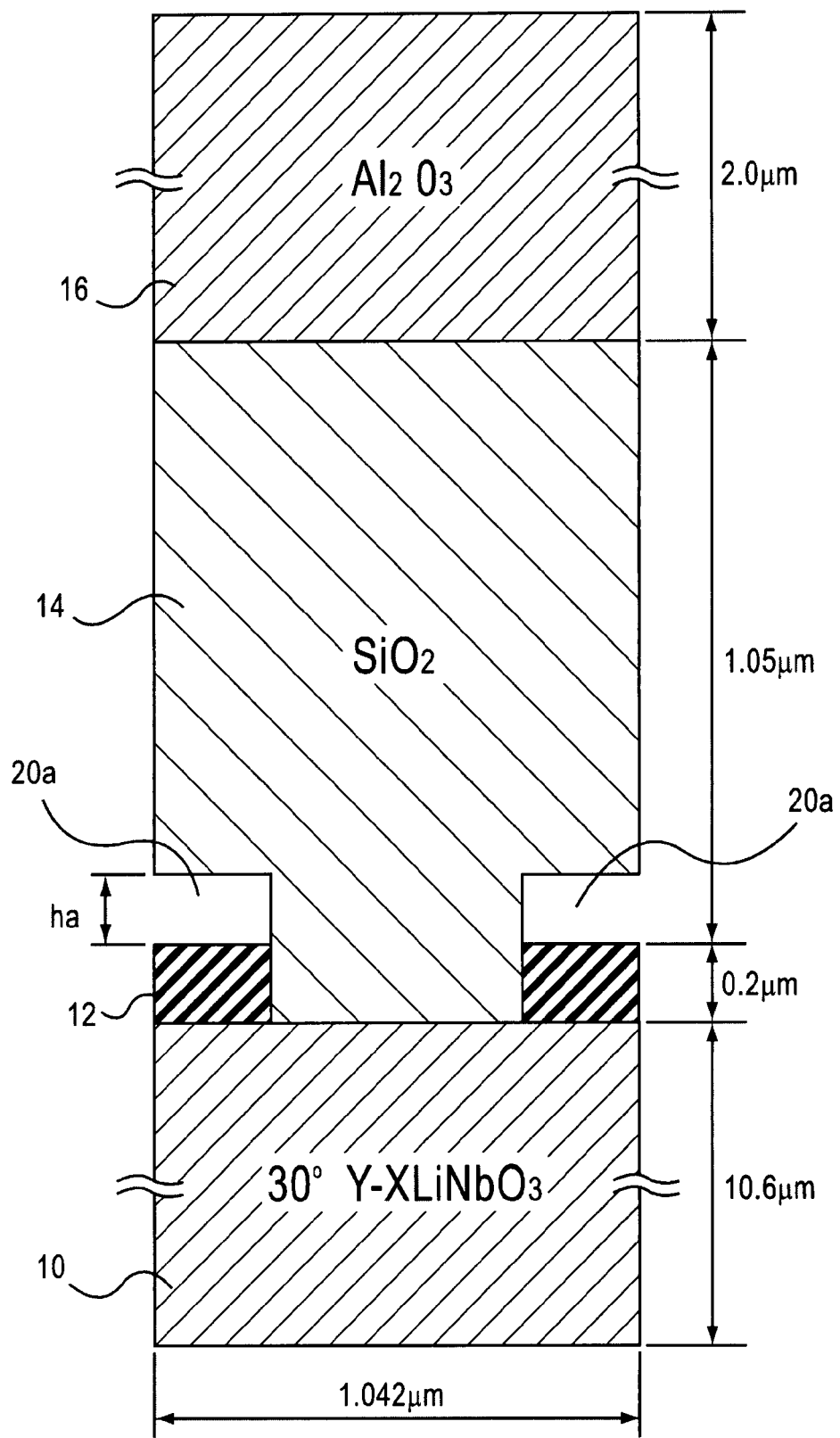
FIG. 6 shows a structure used in simulation for the acoustic wave device of the first embodiment.

FIG. 6 shows a structure used in simulation for he first embodiment in which the first dielectric film 14 has the empty spaces 20a. The first embodiment differs from the first comparative example in which the first dielectric film 14 has the empty spaces 20a that are provided above the electrode 12 so as to contact the upper surfaces thereof. The empty spaces 20a have a width identical to that of each finger of the electrode 12, and have a height ha.

Figure 7:
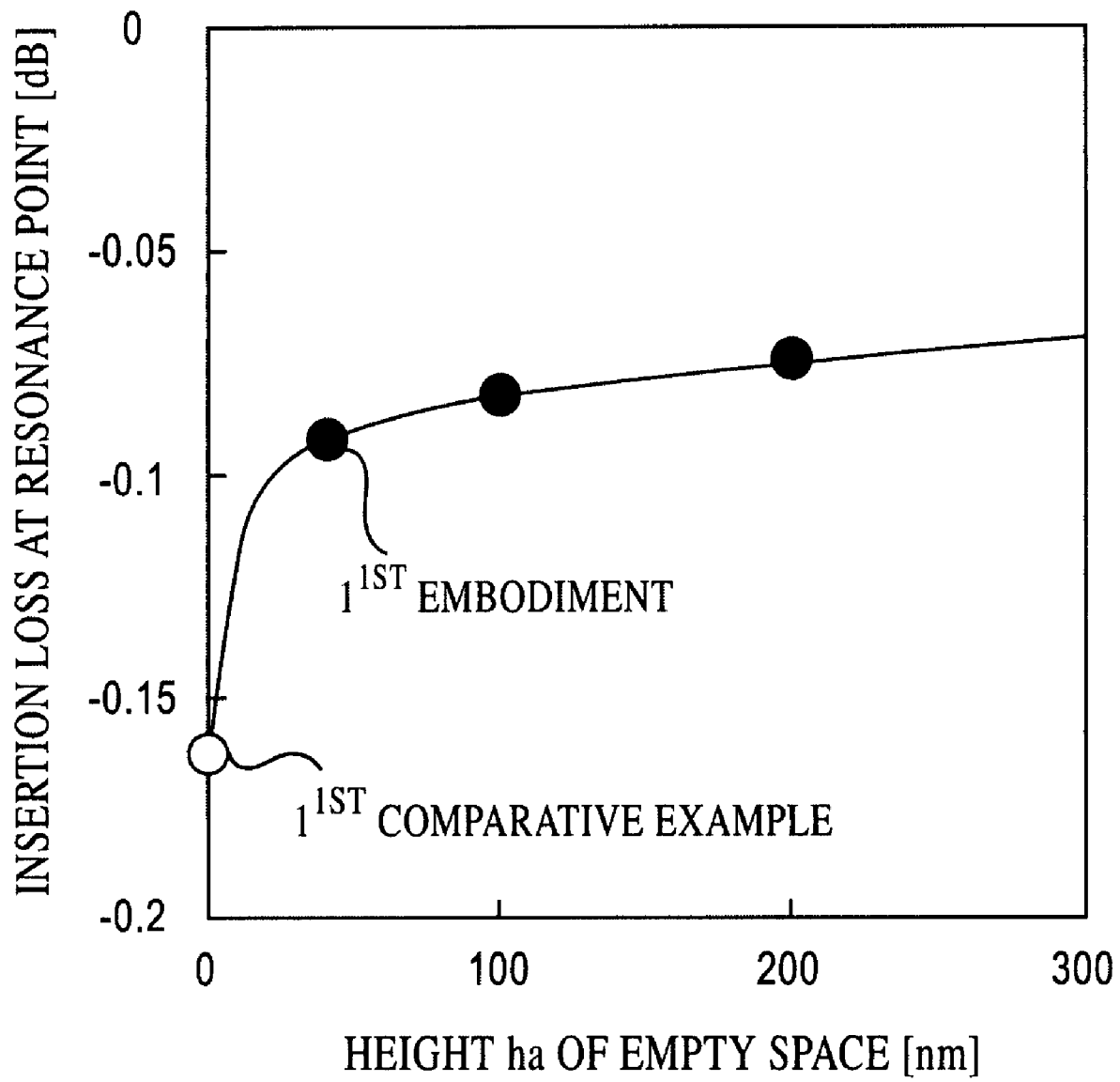
FIG. 7 is a graph of the insertion losses of the first comparative example and the first embodiment as a function of a height ha of an empty space.

FIG. 7 shows results of computation of the insertion loss [dB] of the first embodiment at the resonance point as a function of the height ha [nm]. The first comparative example has a height Ha of 0 [nm]. FIG. 7 shows that the presence of the empty spaces 20a improves the insertion loss. Further, as the height ha becomes greater, the insertion loss is much more improved. When the height ha of the empty spaces 20a is 100 nm, the insertion loss is reduced to almost half the insertion loss of the first comparative example. The presence of the empty spaces 20a makes it for vibration of the electrode 12 difficult to conduct the first dielectric film 14. This reduces energy of the acoustic wave propagated in the dielectric film 14 having a small Q.

Second Embodiment

Figure 8:
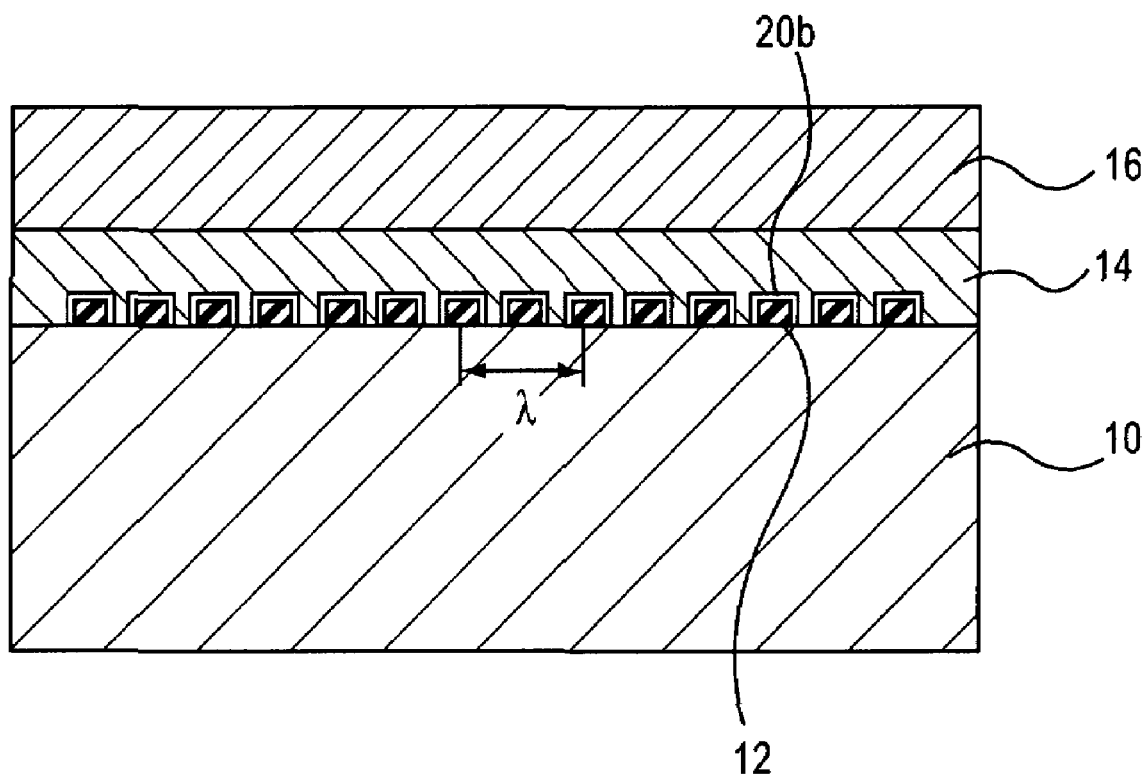
FIG. 8 is a cross-sectional view in accordance with a second embodiment.
Figure 9:
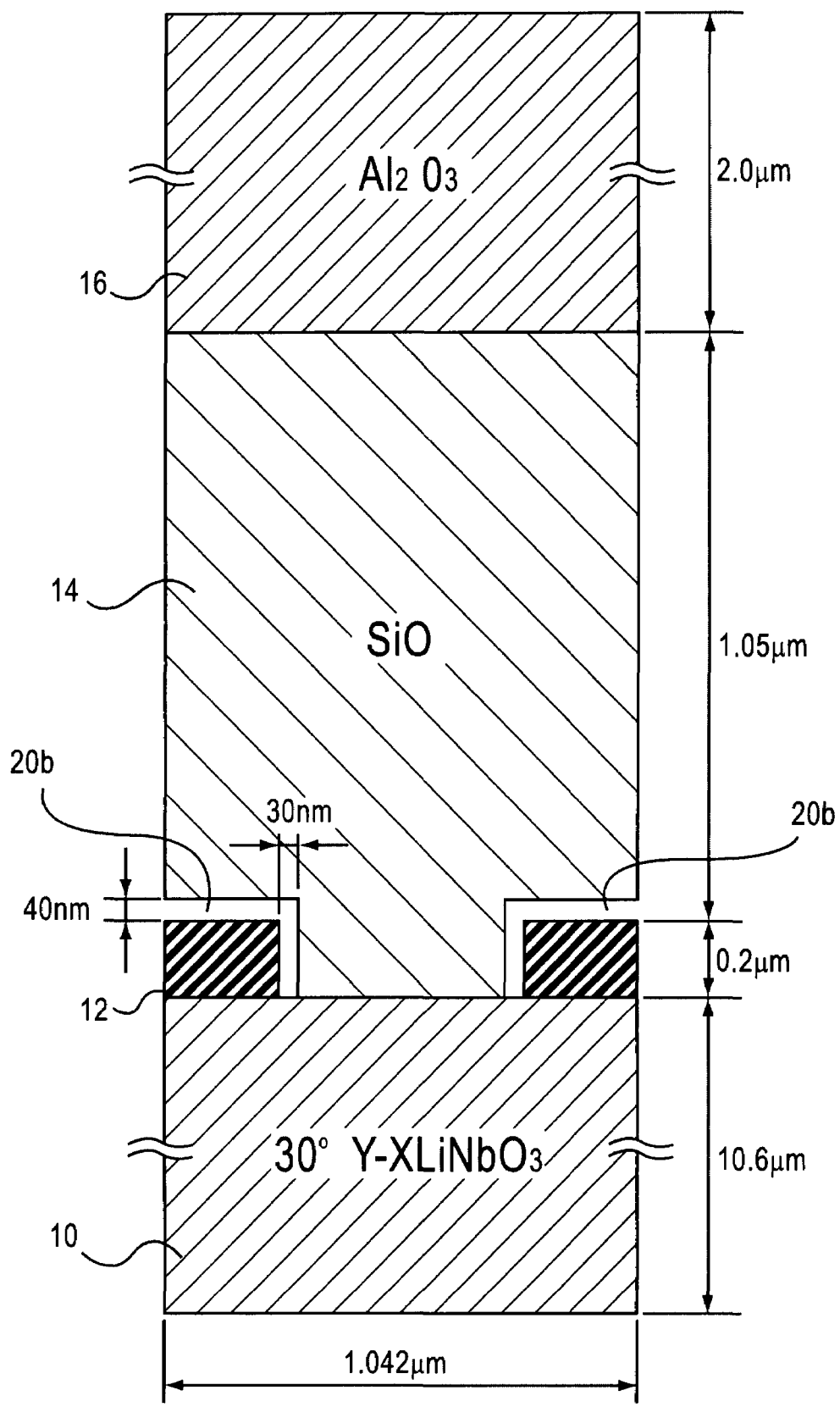
FIG. 9 shows a structure used in a simulation for the acoustic wave device of the second embodiment.

A second embodiment has an exemplary structure in which empty spaces are provided not only on the upper surfaces of the electrode but also along side surfaces thereof. FIG. 8 is a cross-sectional view of a resonator in accordance with a second embodiment. Empty spaces 20b are provided on the upper surfaces of the electrode 12 and are provided along the side surfaces thereof. The other structures of the second embodiment are the same as those of the first embodiment shown in FIG. 4B. FIG. 9 shows a structure used in simulation for the second embodiment. The empty spaces 20b has a height of 40 nm from the upper surface of the electrode 12 and a width ha of 30 nm measured from the side surfaces thereof.

Figure 10:
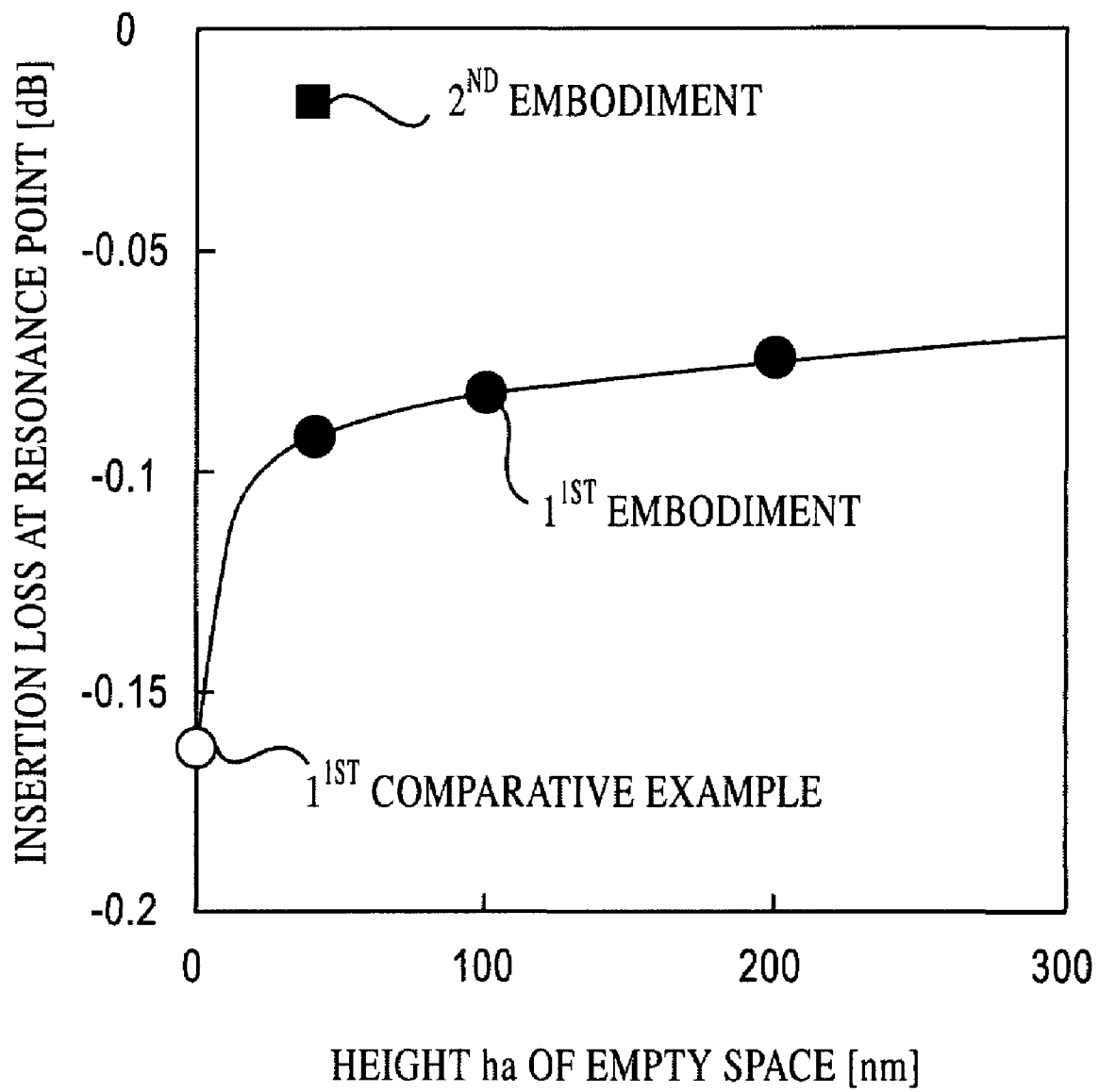
FIG. 10 is a graph of the insertion loss of the second embodiment as a function of the height ha of the empty space.

FIG. 10 shows results of computation of the insertion loss [dB] of the second embodiment at the resonance point as a function of the height ha [nm]. It is possible to greatly improve the insertion loss of the resonator by providing the empty spaces 20b so as to contact not only the upper surfaces of the electrode 12 but also the side surfaces thereof.

Third Embodiment

Figure 11:
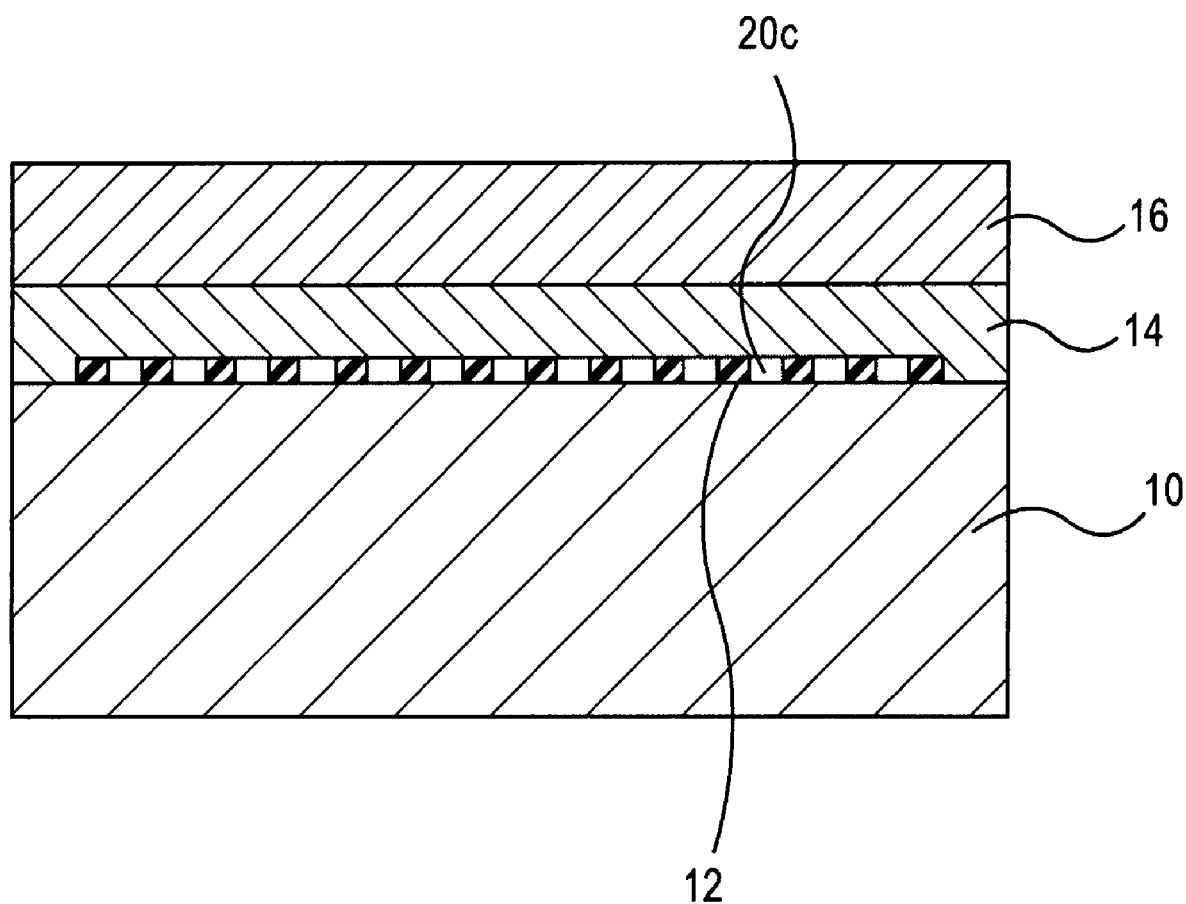
FIG. 11 is a cross-sectional view of an acoustic wave device in accordance with a third embodiment.
Figure 12:
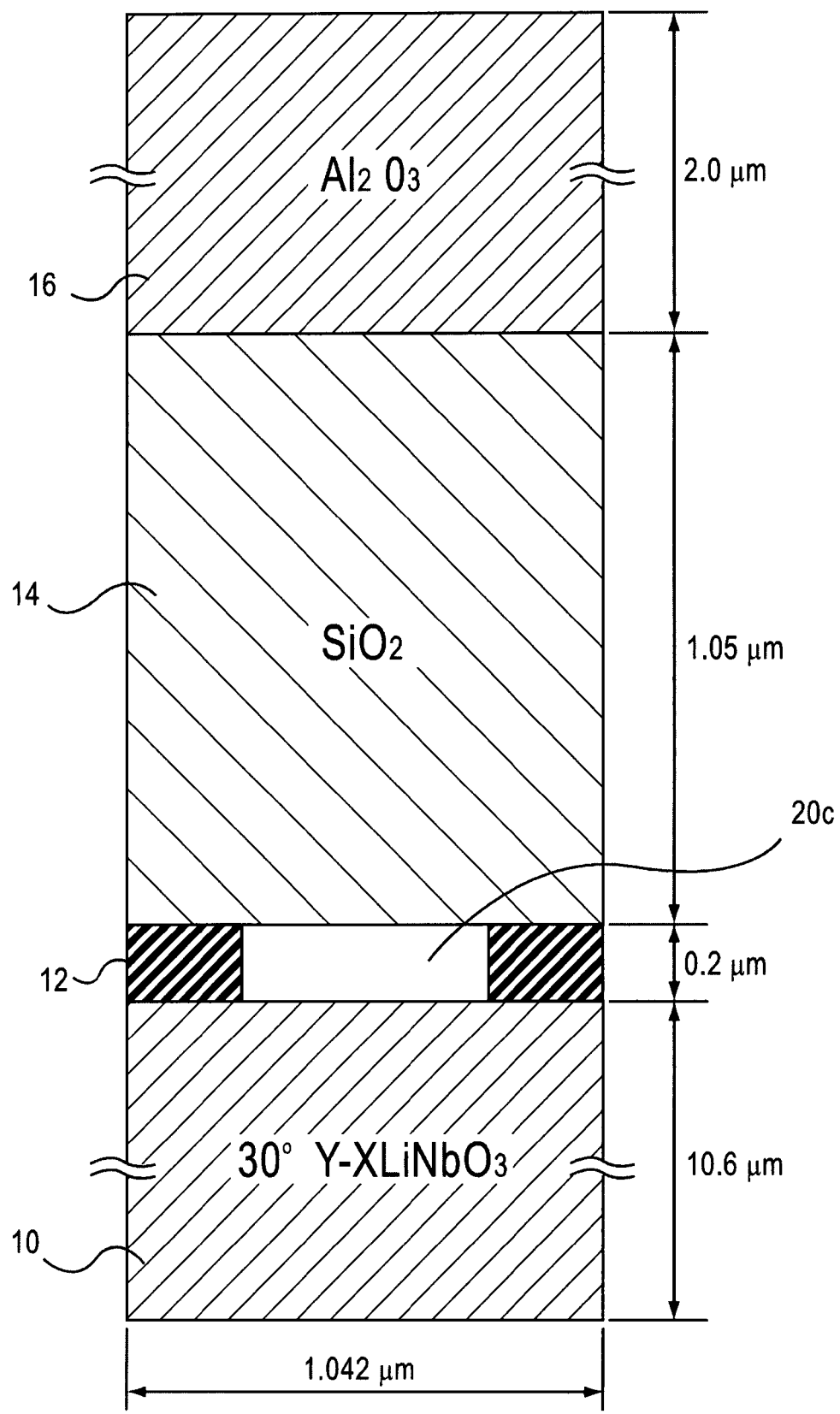
FIG. 12 shows a structure used in simulation for the acoustic wave device of the third embodiment.

A third embodiment has an exemplary structure in which empty spaces are provided between fingers of the electrode 12. FIG. 11 is a cross-sectional view of a resonator in accordance with a third embodiment. As is shown in FIG. 11, empty spaces 20c are continuously provided between electrode fingers so that opposing side surfaces of adjacent interleaving electrode fingers face each other. In other words, the empty spaces 20c are provided so as to connect the adjacent electrode fingers. The empty spaces 20c are continuous to the electrode fingers. The other structures of the third embodiment are the same as those of the first embodiment shown in FIG. 4B. FIG. 12 shows a structure used in simulation for the third embodiment. The empty spaces 20c have a height 0.2 μm which is equal to the height of the electrode 12.

Figure 13:
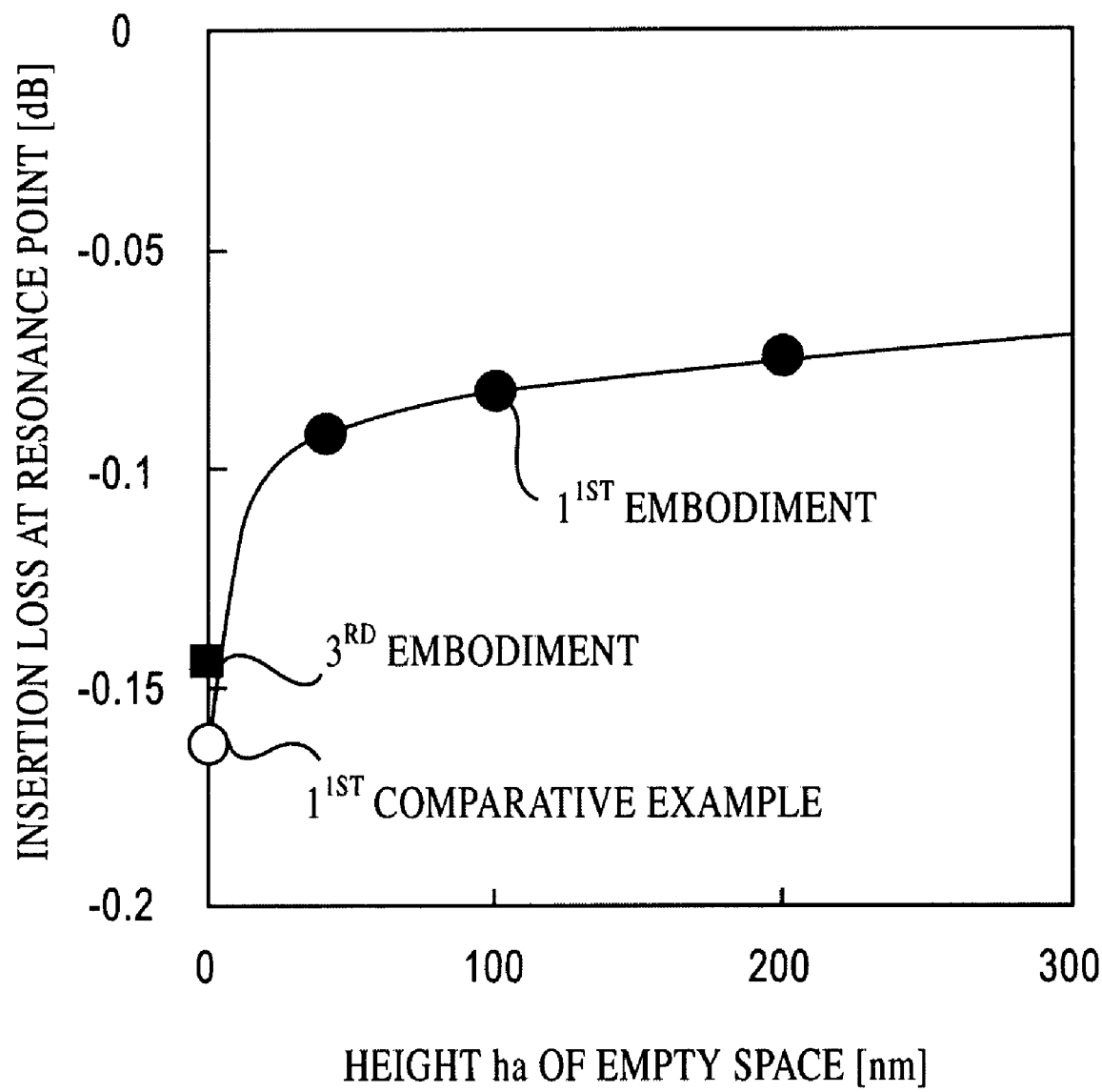
FIG. 13 is a graph of the insertion loss of the third embodiment as a function of the height ha of the empty space.

FIG. 13 results of computation of the insertion loss [dB] of the third embodiment at the resonance point as a function of the height ha [nm]. The empty spaces 20c continuously provided between the electrode fingers of the electrode 12 further improve the insertion loss.

Fourth Embodiment

Figure 14:
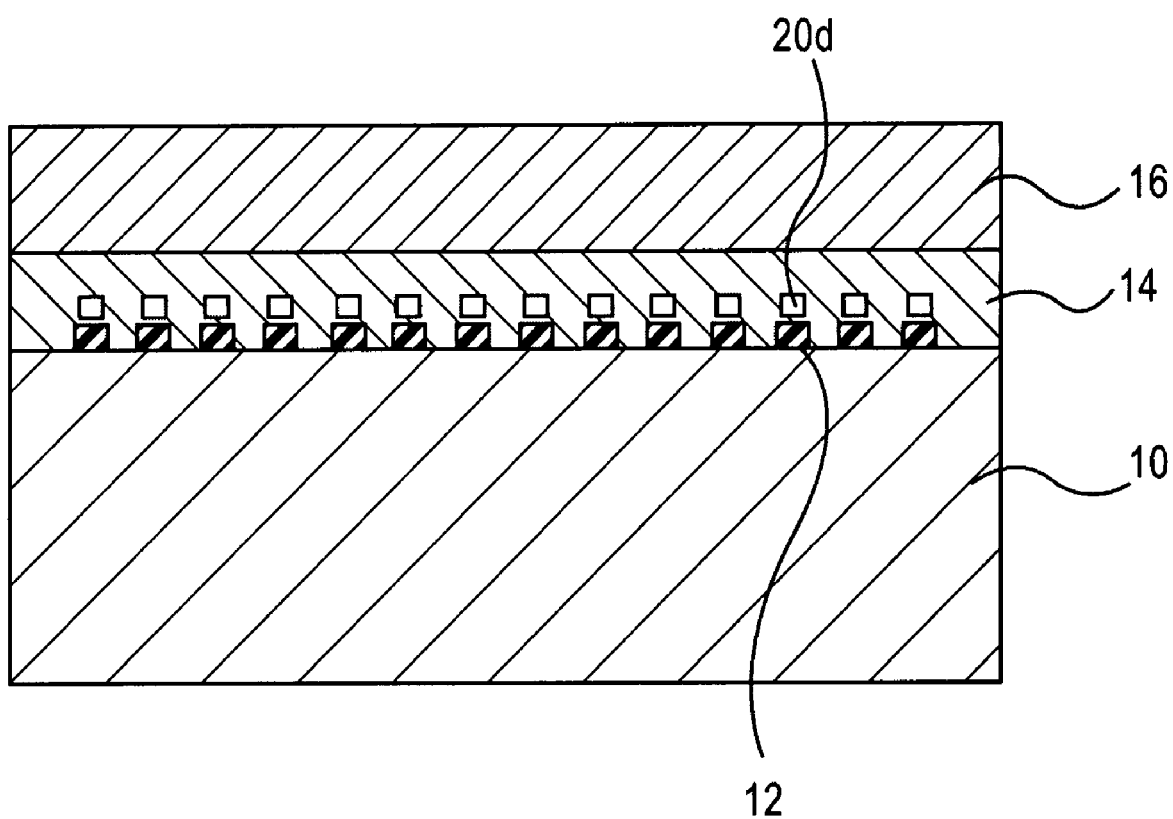
FIG. 14 is a cross-sectional view of an acoustic wave device in accordance with a fourth embodiment.
Figure 15:
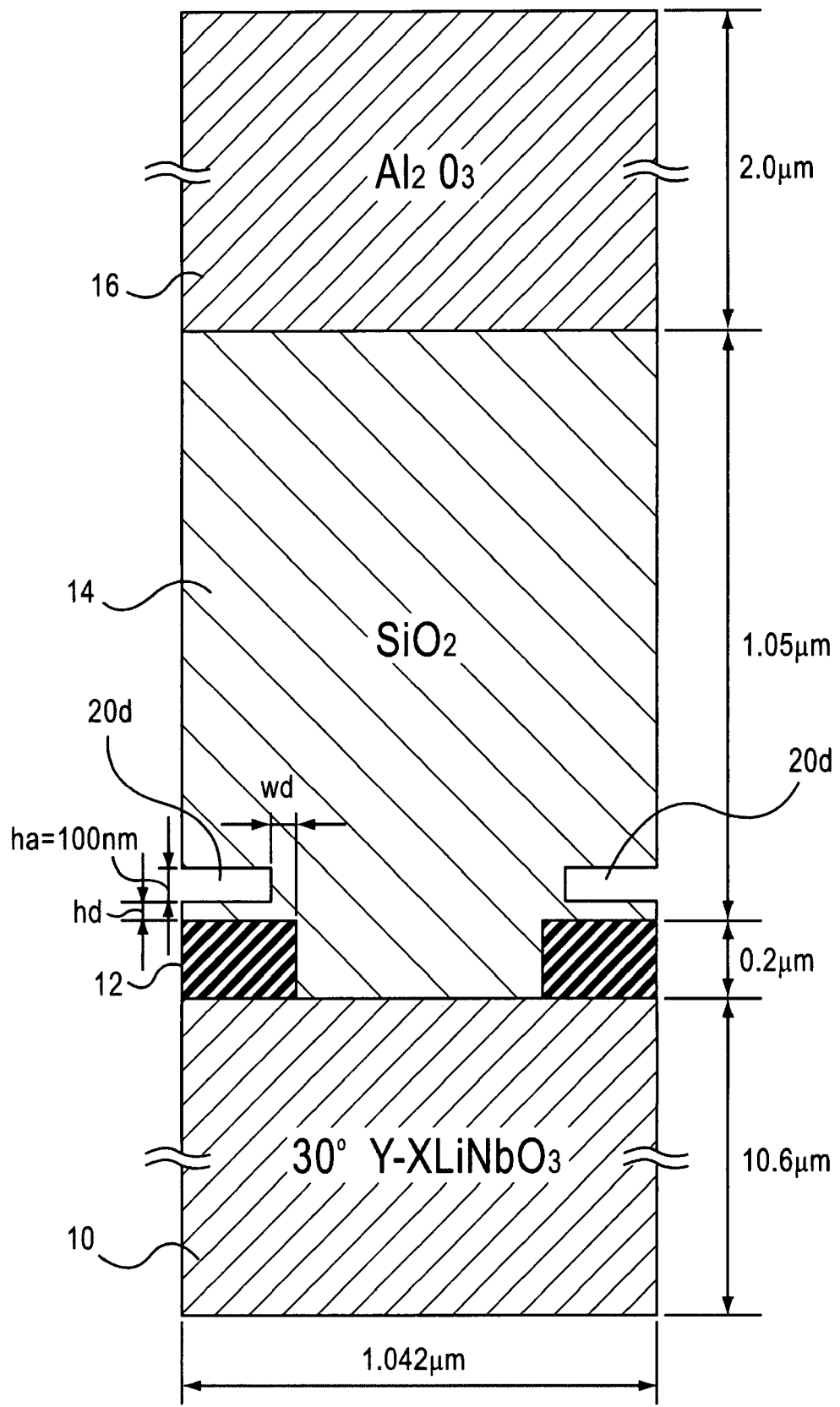
FIG. 15 shows a structure used in simulation for the acoustic wave device of the fourth embodiment.

A fourth embodiment has an exemplary structure in which empty spaces are provided above the electrode 12 through a part of the first dielectric film 14. FIG. 14 is a cross-sectional view of a resonator in accordance with the fourth embodiment. Referring to FIG. 14, empty spaces 20d are provided in the dielectric film 14 so that the empty spaces 20d are located above the electrode fingers of the electrode 12 so as to be away therefrom through the part of the first dielectric film 14. The other structures of the fourth embodiment are the same as those of the first embodiment shown in FIG. 4B. FIG. 15 shows a structure used in simulation for the fourth embodiment. The empty spaces 20d are provided above the fingers of the electrode 12 through a part of the first dielectric film 14. A symbol hd is the height of the part of the first dielectric film 14 between the fingers of the electrode 12 and the empty spaces 20d. The height ha of the empty spaces 20d is 100 nm, and the side surfaces of the empty spaces 20d are further in than the side surfaces of the fingers of the electrode 12 by an offset width wd.

Figure 16A:
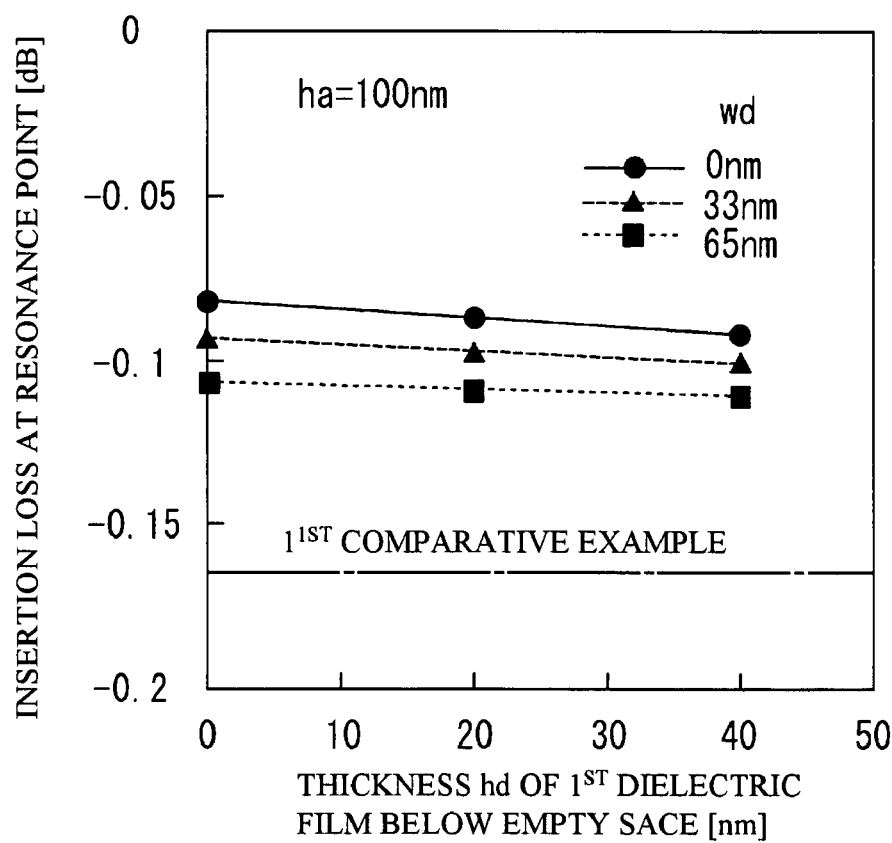
FIG. 16A is a graph of the insertion loss of the fourth embodiment as a function of the thickness hd of a first dielectric film below an empty space.
Figure 16B:
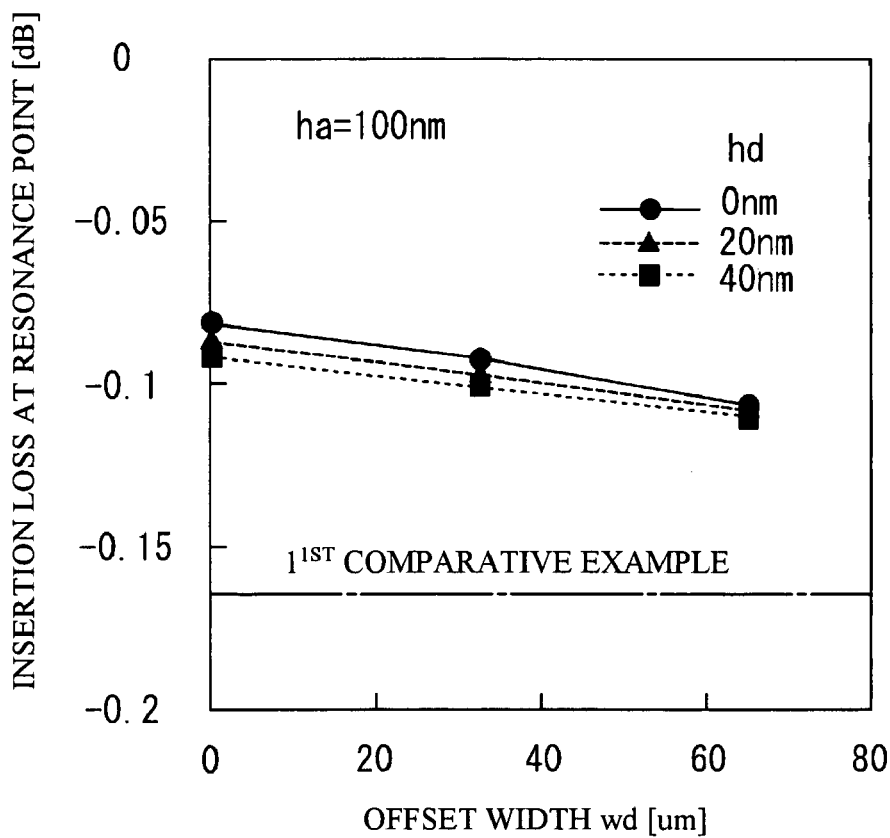
FIG. 16B is a graph of the insertion loss of the fourth embodiment as a function of a lateral offset wd of an empty space.

FIGS. 16A and 16B show insertion loss of the fourth embodiment at the resonance point. More particularly, FIG. 16A shows the insertion loss [dB] at the resonance point as a function of the thickness hd [nm] of the first dielectric film below the empty spaces, and FIG. 16B shows the insertion loss [dB] at the resonance point as a function of the offset width wd [μm]. It can be seen from FIG. 16A that the insertion loss deteriorates as the thickness hd of the first dielectric film below the empty spaces 20d increases. It can be seen from FIG. 16B that the insertion loss deteriorates as the offset width wd shown in FIG. 15 increases. However, it is to be noted that the insertion losses shown in FIGS. 16A and 16B are quite smaller than the first comparative example indicated by one-dotted chain lines. It can be said that the insertion loss can be reduced even when the empty spaces 20d are not close to the electrode 12. Further, it can be said that the insertion loss can be reduced even when the side surfaces of the empty spaces 20d are further in than those of the fingers of the electrode 12.

As in the case of the first, second and fourth embodiments, the empty spaces provided in contact with the electrode 12 or are provided through the part of the first dielectric film 14, so that energy of the acoustic wave propagated in the first dielectric film 14 having a small Qm can be reduced. Thus, the insertion loss of the resonator can be improved. Several variations may be made. Preferably, the empty spaces are provided for all the fingers of the electrode 12. In another way, the empty spaces may be provided to some of the electrode fingers. The empty spaces partially provided function to reduce the energy of the acoustic wave propagated in the first dielectric film 14. The empty spaces are preferably provided to the whole lengths of the fingers of the electrode 12 in the direction of aperture length (longitudinal direction of the fingers). In another way, the empty spaces may be provided to a part of the whole length of the electrode fingers. The empty spaces partially provided function to reduce the energy of the acoustic wave propagated in the first dielectric film 14. Preferably, the empty spaces have a width identical to that of fingers of the electrode 12 in the acoustic wave propagating direction (width direction of the electrode fingers). By way of another example, the empty spaces may be narrower than the electrode fingers as in the case of the fourth embodiment.

As in the case of the second embodiment, the empty spaces are preferably provided between the fingers of the electrode 12. With this structure, it is possible to further reduce the energy of the acoustic wave propagated in the first dielectric film 14 and to realize further reduction in the insertion loss of the resonator.

As in the case of the first and second embodiments, the empty spaces are formed so as to contact the electrode 12. The empty spaces may partially contact the electrode 12. Thus, it is possible to further reduce the energy of the acoustic wave propagated in the first dielectric film 14 and to further reduce the insertion loss of the resonator.

Particularly, as in the case of the first embodiment, it is preferable that the empty spaces 20a contact the upper surfaces of the electrode 12. More preferably, as in the case of the second embodiment, the empty spaces 20b contact the upper and side surfaces of the electrode 12. It can be seen from FIGS. 16A and 16B that the insertion loss of the resonator can be further reduced when the empty spaces contact the electrode 12.

As in the case of the second and third embodiments, the empty spaces are arranged to at least a part of the electrode 12, so that the energy of the acoustic wave propagated in the first dielectric film 14 having a small Q can be reduced and the insertion loss of the resonator can be improved.

As in the case of the third embodiment, the empty spaces are continuously provided between the fingers of the electrode 12. It is thus possible to reduce the insertion loss of the resonator as shown in FIG. 13.

When the empty spaces do not contact the electrode 12, the thickness hd of the first dielectric film 14 between the empty spaces and the electrode 12 may not be even over the entire electrode 12. For example, the thickness hd of the first dielectric film above the pair of comb electrodes may be different from that above the reflection electrodes. It is also possible for the first dielectric film 14 to have an uneven thickness hd over the pair of comb electrodes or the reflection electrodes.

Figure 17:
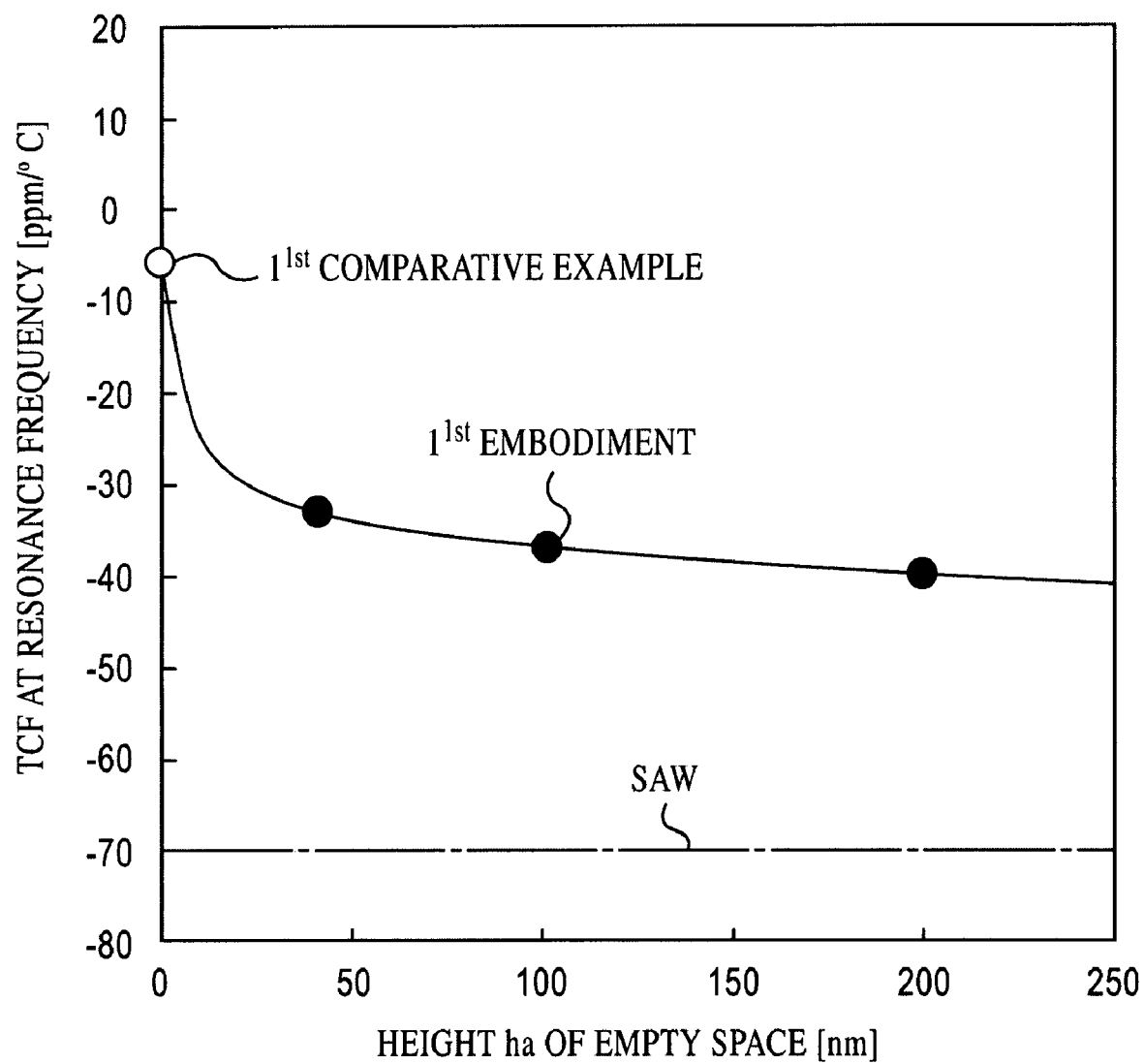
FIG. 17 is a graph of TCF of the first comparative example and the first embodiment as a function of the height ha of the empty space.

FIG. 17 shows results of computation of TCF at the resonance frequency as a function of the height ha of the empty spaces 20a employed in the first embodiment. A one-dotted chain line indicates TCF of a SAW device that is not provided with the first dielectric film 14 and the third dielectric film 16. The resonator of the first embodiment is not degraded as much as a TCF of −70 ppm/° C. that is the TCF of the resonator equipped with the SAW device. However, the resonator of the firs embodiment has a TCF that is 30 ppm/° C. to 40 ppm/° C. worse than that of the resonator of the first comparative example. The empty spaces formed in the first dielectric film 14 provided in order to improve the insertion loss may degrade the TCF as compared to the first comparative example.

Fifth Embodiment

Figure 18:
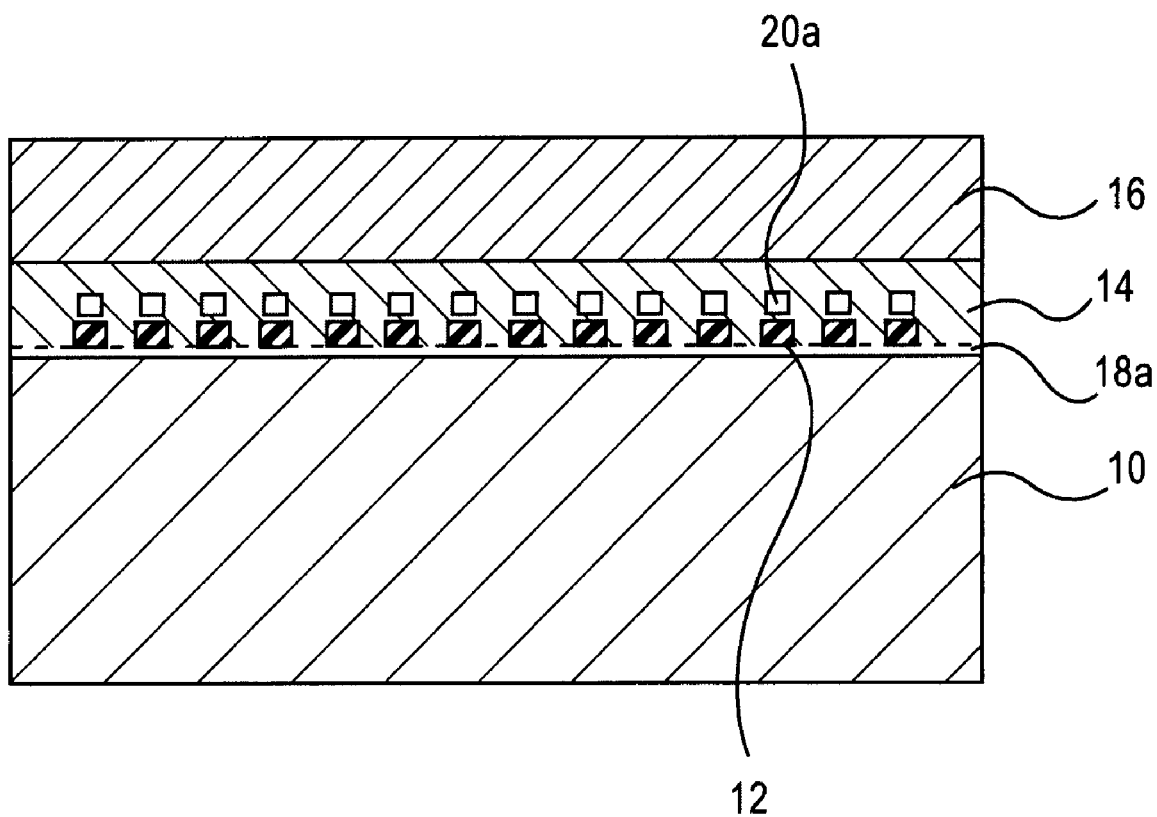
FIG. 18 is a cross-sectional view of an acoustic wave device in accordance with a fifth embodiment.
Figure 19:
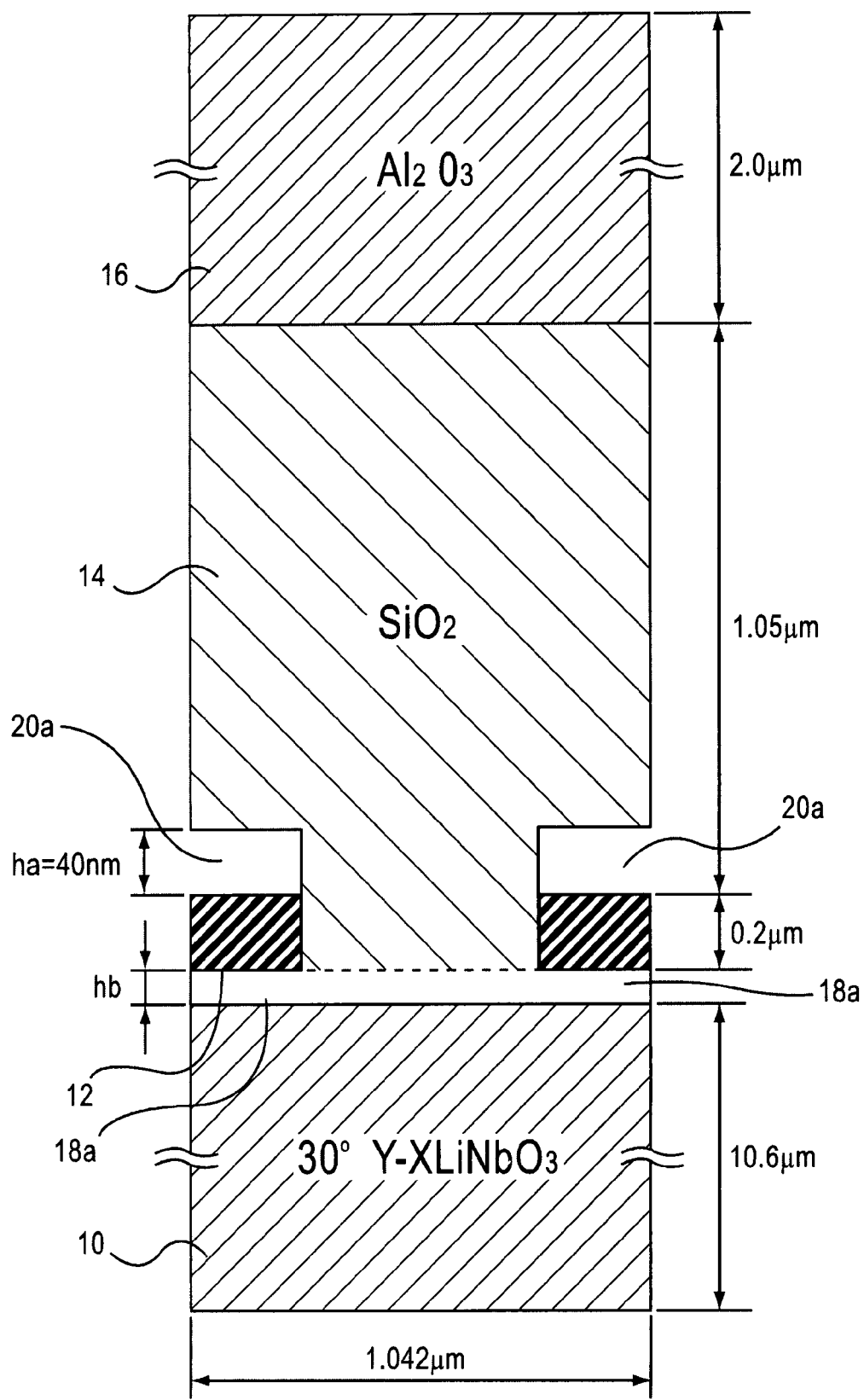
FIG. 19 shows a structure used in simulation for the acoustic wave device of the fifth embodiment.

Referring to FIG. 18, a fifth embodiment has an exemplary structure in which a second dielectric film 18a formed by a silicon oxide film is provided below the electrode 12. Thus, the electrode 12 is provided above the piezoelectric substrate 10. The other structures of the fifth embodiment are the same as those of the first embodiment shown in FIG. 4B. FIG. 19 shows a structure used in simulation for the fifth embodiment. The first dielectric film 14 has empty spaces 20a that are formed above the electrode 12 and have a height of 40 nm high. The second dielectric film 18a is provided between the electrode 12 and the piezoelectric substrate 10 and is made of silicon oxide, which is also used for forming the first dielectric film 14. The second dielectric film 18a has a thickness hb. Simulation for a second comparative example having the second dielectric film 18a provided below the electrode 12 of the first comparative example was conducted.

Figure 20:
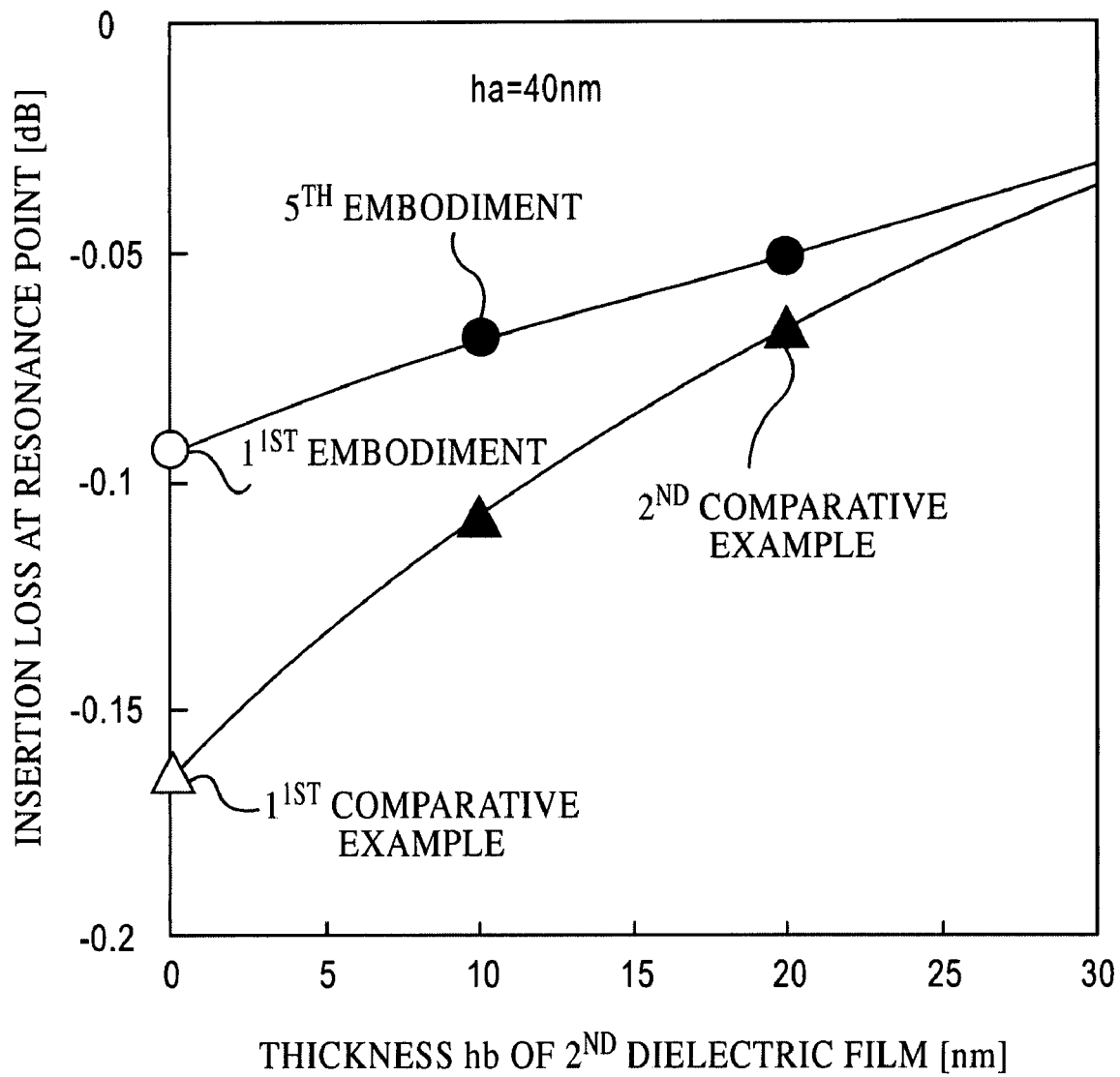
FIG. 20 is a graph of the insertion losses of a second comparative example and the fifth embodiment as a function of the thickness hb of a second dielectric film.

FIG. 20 is a graph of insertion losses [dB] of the resonators of the fifth embodiment and the second comparative example at a resonance frequency as a function of the thickness hb [nm] of the second dielectric film 18a. The fifth embodiment for hb of 0 [nm] corresponds to the first embodiment, and the second comparative example for hp of 0 [nm] corresponds to the first comparative example. In the fifth embodiment and the second comparative example, the insertion loss is better, as the thickness hb of the second dielectric film 18a *becomes greater.*

Figure 21:
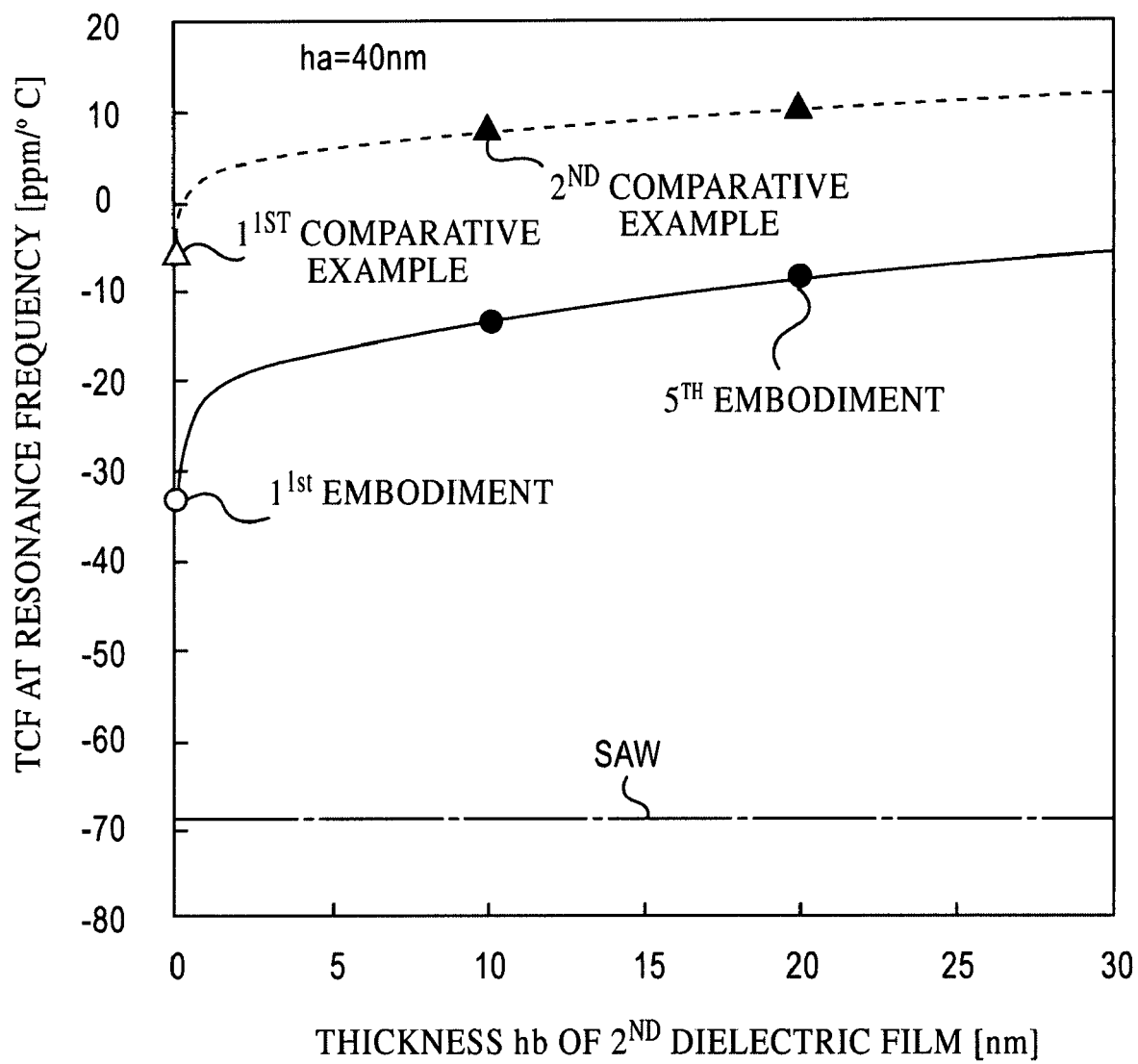
FIG. 21 is a graph of TCF of the second comparative example and the fifth embodiment as a function of the thickness hb of the second dielectric film.

FIG. 21 shows TCF [ppm/° C.] at the resonance frequency of the resonators of the fifth embodiment and the second comparative example as a function of the thickness hb [nm] of the second dielectric film 18a. In the fifth embodiment and the second comparative example, TCF becomes greater as the thickness hb of the second dielectric film 18a becomes greater. In the fifth embodiment, as the thickness hb of the second dielectric film 18a is greater, TCF is closer to 0. It can be seen from FIGS. 20 and 21 that the insertion loss can be reduced and the absolute value of TCF can be reduced by increasing the thickness hd of the second dielectric film 18a in the fifth embodiment.

Figure 22:
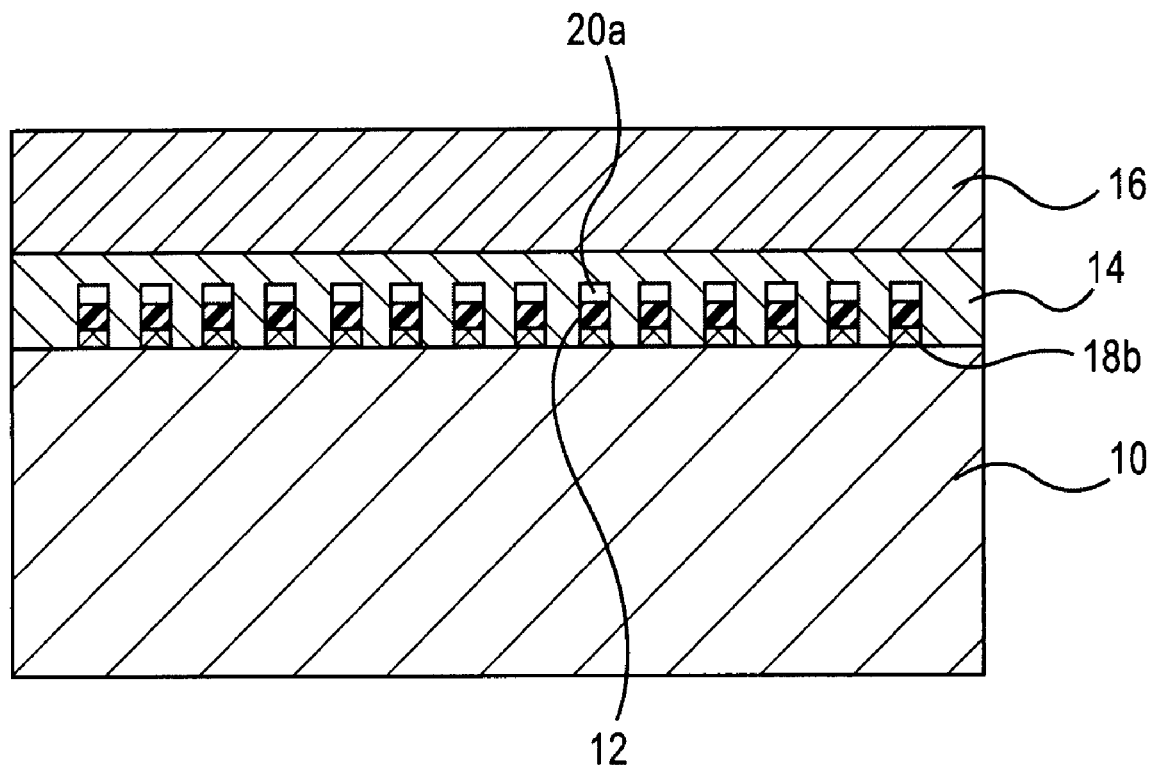
FIG. 22 is a cross-sectional view of an acoustic wave device in accordance with a first variation of the fifth embodiment.
Figure 23:
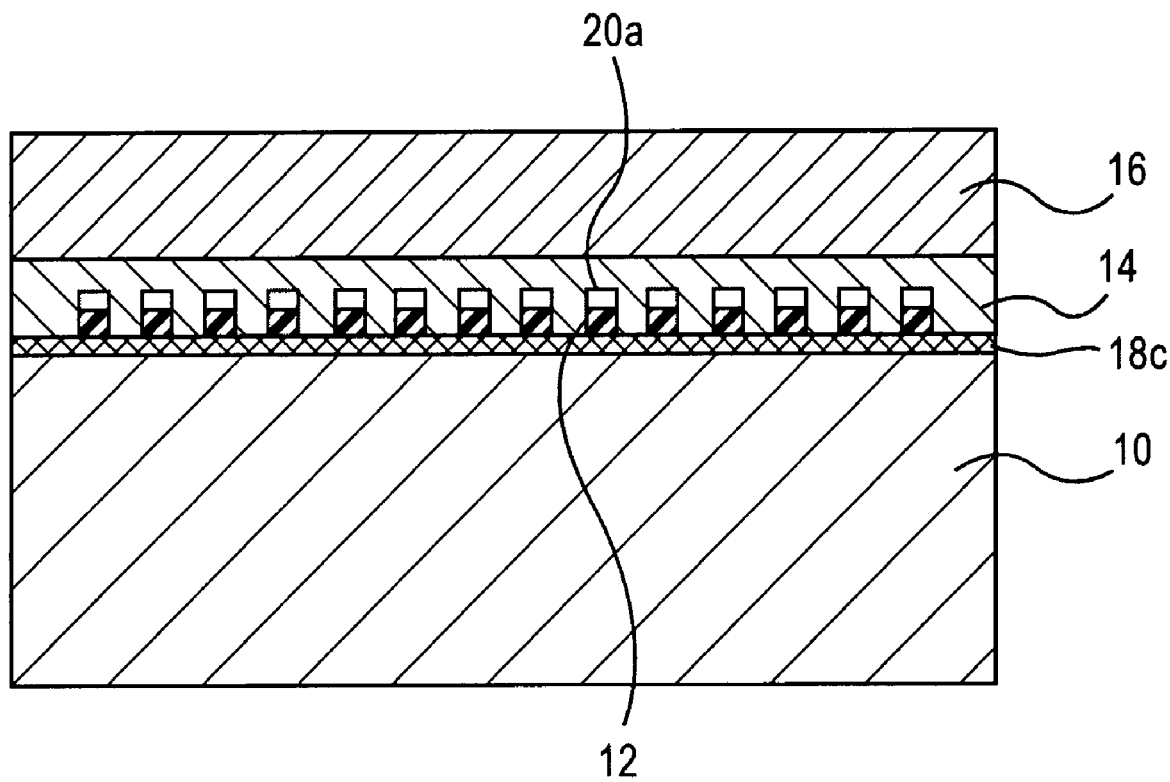
FIG. 23 is a cross-sectional view of an acoustic wave device in accordance with a second variation of the fifth embodiment.
Figure 24:
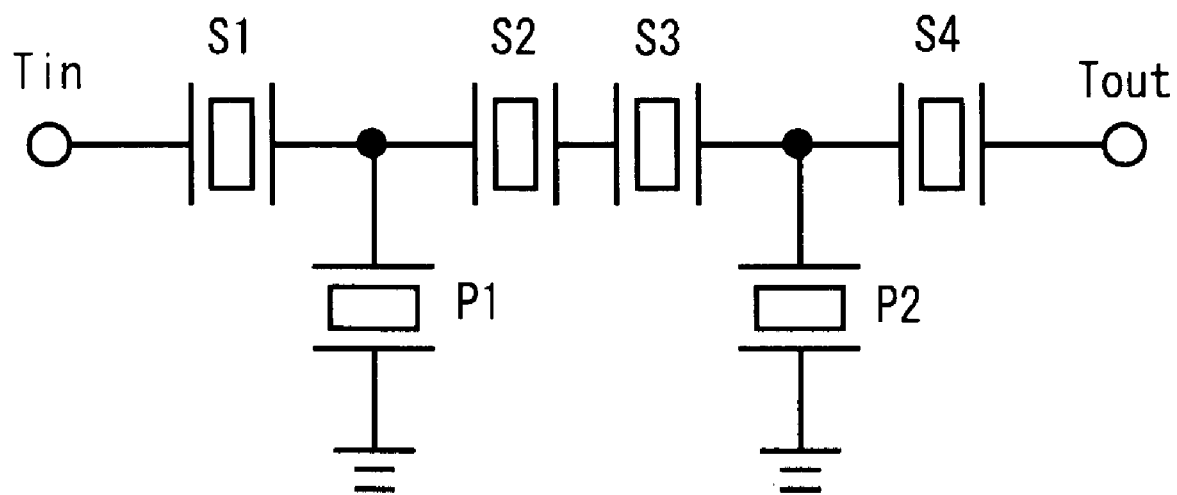
FIG. 24 is a circuit diagram of a filter in accordance with a sixth embodiment.

Referring to FIG. 22, there is illustrated a resonator in accordance with a first variation of the fifth embodiment. A second dielectric film 18b, which may, for example, be made of aluminum oxide, is provided between the electrode 12 and the piezoelectric substrate 10. It is to be noted that the second dielectric film 18b is not provided between adjacent fingers of the electrode 12. Thus, the first dielectric film 14 contacts the piezoelectric substrate 10 between the fingers of the electrode 12. Referring to FIG. 23, there is illustrated a resonator in accordance with a second variation of the fifth embodiment. A second dielectric film 18c, which may, for example, be made of aluminum oxide, is provided between the electrode 12 and the piezoelectric substrate 10. It is to be noted that the second dielectric film 18c is continuously provided even between the adjacent fingers of the electrode 12.

The fifth embodiment and the firs and second variations thereof are equipped with the second dielectric films 18a, 18b and 18c between the piezoelectric substrate 10 and the electrode 12. It is thus possible to reduce the insertion loss and TCF as shown in FIGS. 21 and 22.

The second dielectric film 18a may be made of the same material as that of the first dielectric film 14 as in the case of the fifth embodiment. The second dielectric films 18b and 18c may be made of a material different from that of the first dielectric film 14 as in the case of the first and second variations of the fifth embodiment. There is a case where the dielectric constant of the second dielectric film 18 is much smaller than that of the piezoelectric substrate 10. In this case, the second dielectric film 18 may decrease the electrostatic capacitance of the pair IDT0 of comb electrodes. The decrease of the electrostatic capacitance of the electrode pair IDT0 may cause impedance mismatch of the acoustic wave device. In order to minimize the impedance mismatch, it is preferable that the second dielectric film 18 has a large dielectric constant. It is thus preferable that the second dielectric film 18 is made of a material having a greater dielectric constant than that of the first dielectric film 14.

Preferably, the second dielectric film 18 is an aluminum oxide film. It is thus possible to reduce the thickness dependence of the electromechanical coupling constant of the second dielectric film 18. It is thus possible to suppress differences in the performance of the acoustic wave devices resulting from differences in the thickness of the second dielectric film 18. Further, it is possible to improve resistance to dry or wet etching of the second dielectric film 18 and to thus fabricate the acoustic wave devices more easily.

The fifth embodiment employs the second dielectric film 18 applied to the acoustic wave device of the first embodiment. The second dielectric film 18 may be applied to any of the acoustic wave devices of the second through fourth embodiments. The acoustic wave device with the second dielectric film 18 provides advantages similar to those of the fifth embodiment.

Figure 1A:
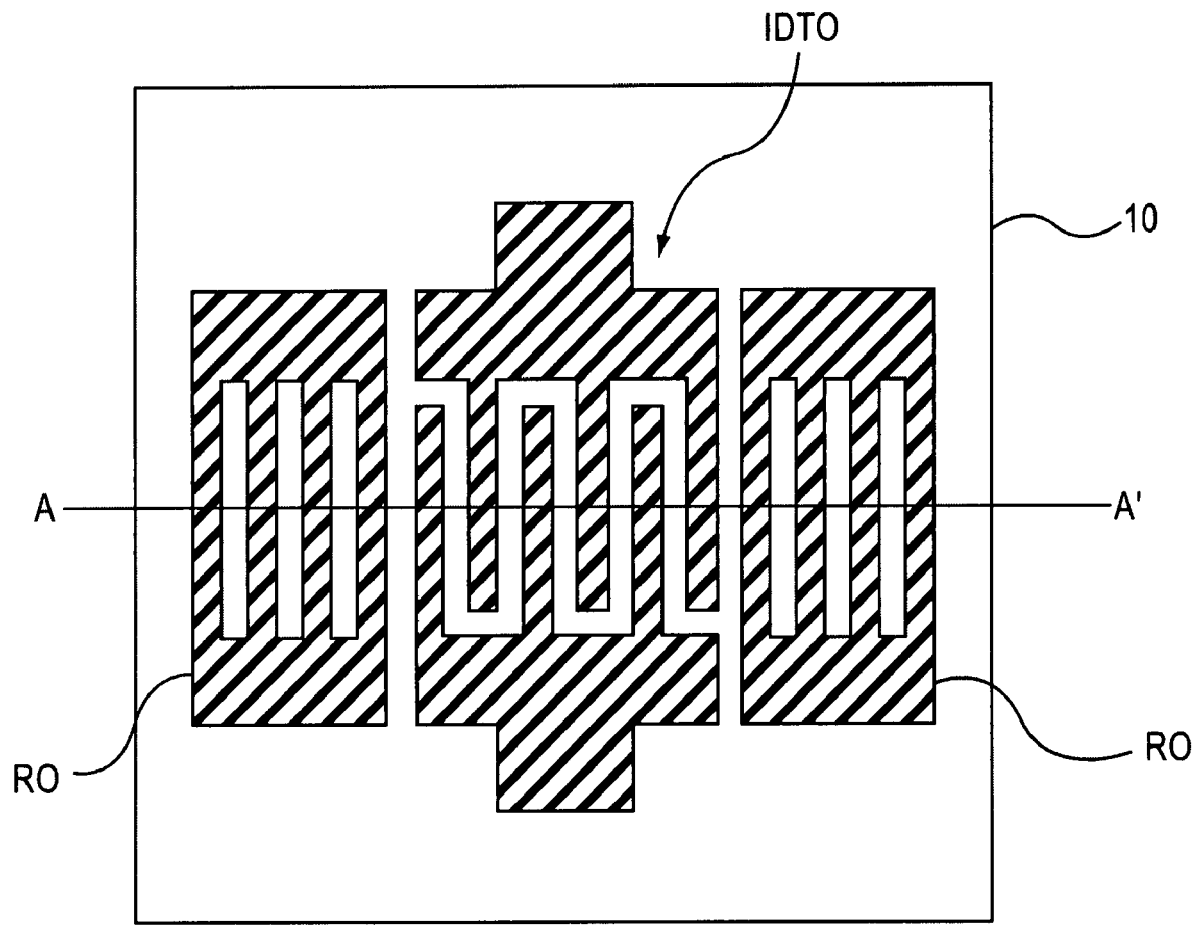
FIG. 1A is a plan view of a resonator using a conventional surface acoustic wave device.
Figure 1B:
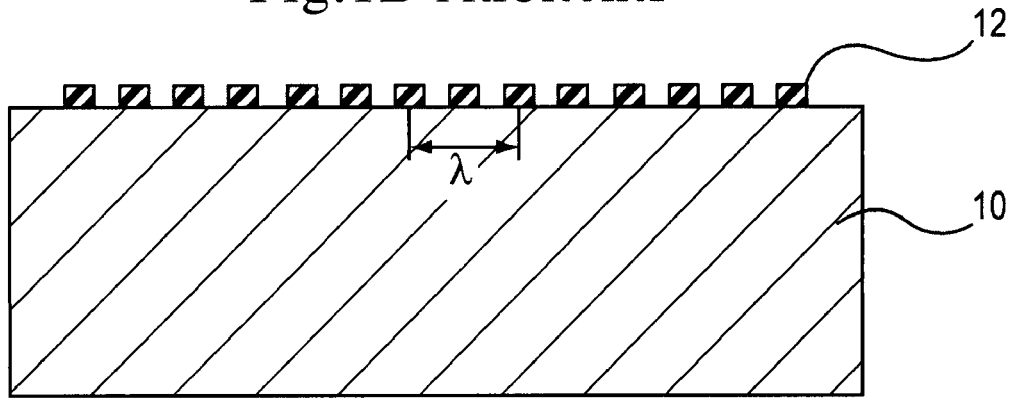
FIG. 1B is a cross-sectional view taken along a line A-A' shown in FIG. 1A.
Figure 2:
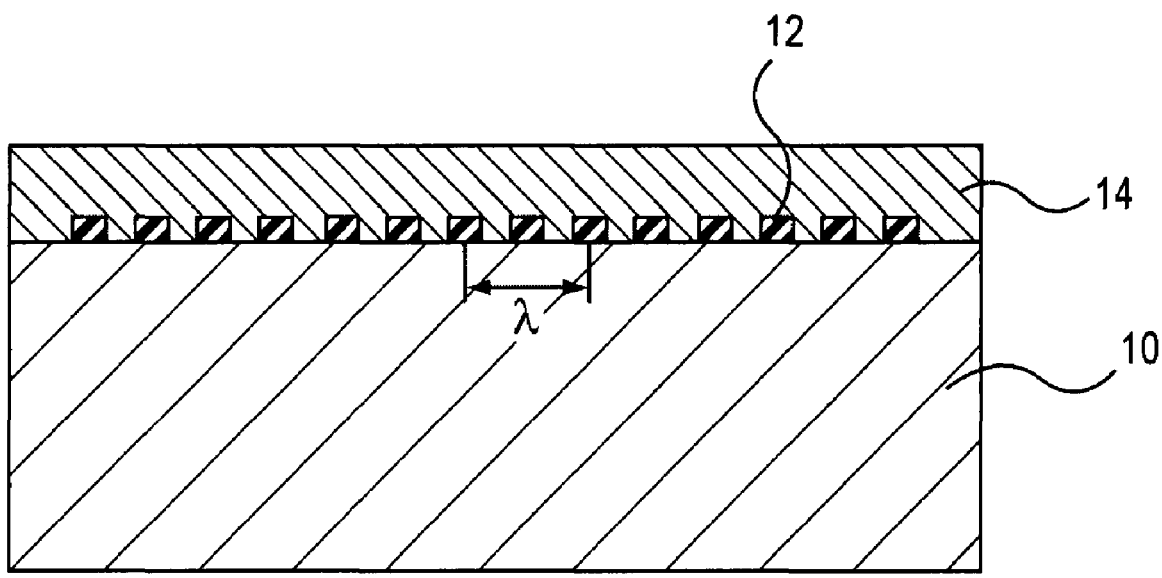
FIG. 2 is a cross-sectional view of a conventional acoustic wave device using an acoustic boundary wave.
Figure 3:
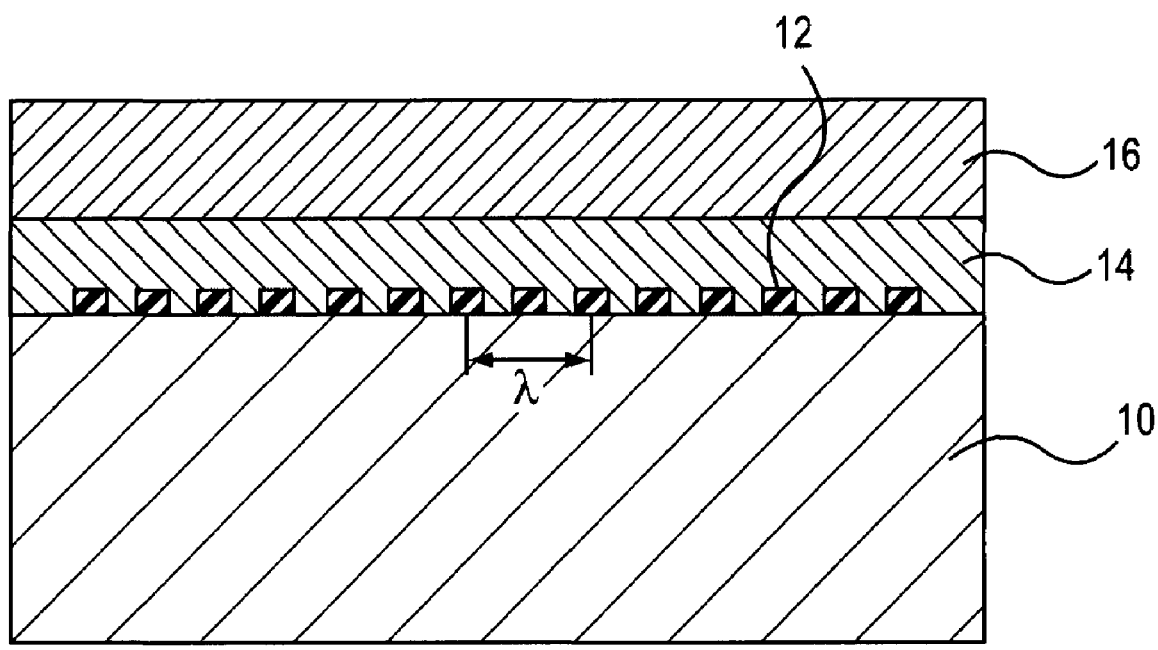
FIG. 3 is a cross-sectional view of a conventional acoustic wave device using a Love wave.

The acoustic wave devices of the first through fifth embodiments use acoustic boundary waves and have the third dielectric film 16 provided on the first dielectric film 14. The acoustic wave device shown in FIG. 2 that uses the Love wave without the third dielectric film 16 may be varied so that empty spaces are provided in the first dielectric film 14 as in the case of the first through fifth embodiments. These variations may have advantages similar to those of the first through fifth embodiments.

Preferably, the propagation velocity of the acoustic wave in the third dielectric film 16 is greater than that of the acoustic wave in the first dielectric film 14. It is thus possible to confine the acoustic wave within the first dielectric film 14.

Preferably, the third dielectric film 16 may be an aluminum oxide film, so-that the film 16 can be formed easily.

In the first through fifth embodiments, the piezoelectric substrate 10 may include lithium niobate or lithium tantalate, so that a large electromechanical coupling coefficient can be increased and the insertion loss can be reduced.

Preferably, the electrode 12 includes a heavy element such as copper. The electrode 12 is made of an element having a density greater than that of the first dielectric film 14. With this structure, it is possible to obtain satisfactory reflection of the acoustic wave by the electrode 12.

Sixth Embodiment

A sixth embodiment is an exemplary ladder filter having an acoustic wave device that is configured according to any of the first through fifth embodiments. Referring to FIG. 4, there are provided series resonators S1 through S4 between an input terminal Tin and an output terminal Tout. A parallel resonator P1 is connected between a node interposed between the series resonators S1 and S2 and ground. Similarly, a parallel resonator P2 is connected between a node connecting the series resonators S3 and S4 and ground. The ladder filter using the resonators configured by any of the first through fifth embodiments has a small insertion loss and a small TCF.

Seventh Embodiment

Figure 25:
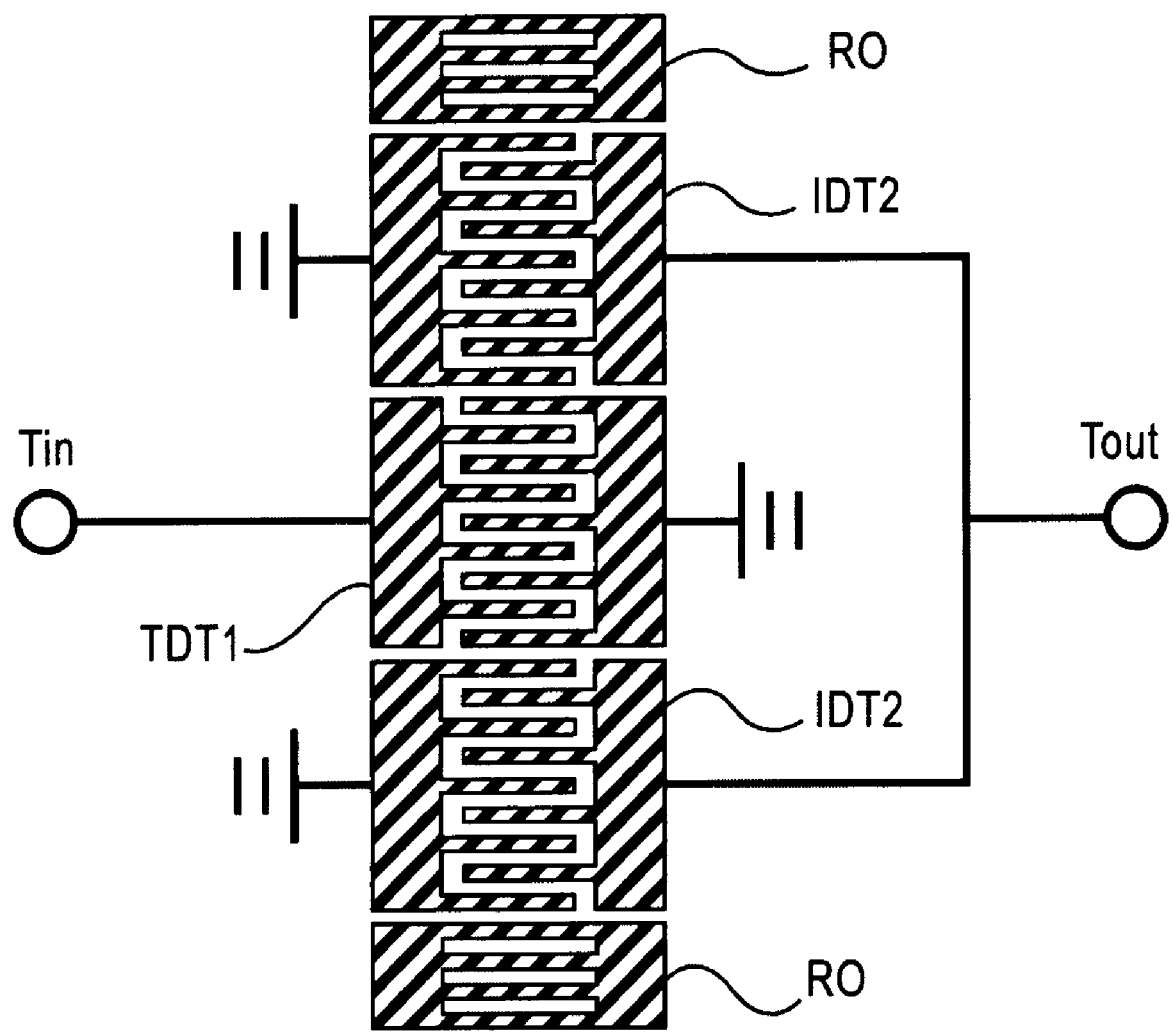
FIG. 25 is a plan view of a filter in accordance with a seventh embodiment.

A seventh embodiment is an exemplary multimode filter using a resonator configured by any of the first through fifth embodiments. Referring to FIG. 25, an input pair IDT1 of comb electrodes is connected to the input terminal Tin, and two output pairs IDT2 of comb electrodes are connected to the output terminal Tout. The two output pairs IDT2 of comb electrodes are arranged at both sides of the input pair IDT1 of comb electrodes in an acoustic wave propagating direction. Two reflection electrodes R0 are arranged further out than the two output pairs IDT2. The multimode filter using the resonators configured by any of the first through fifth embodiments has a small insertion loss and a small TCF.

Eight Embodiment

Figure 26:
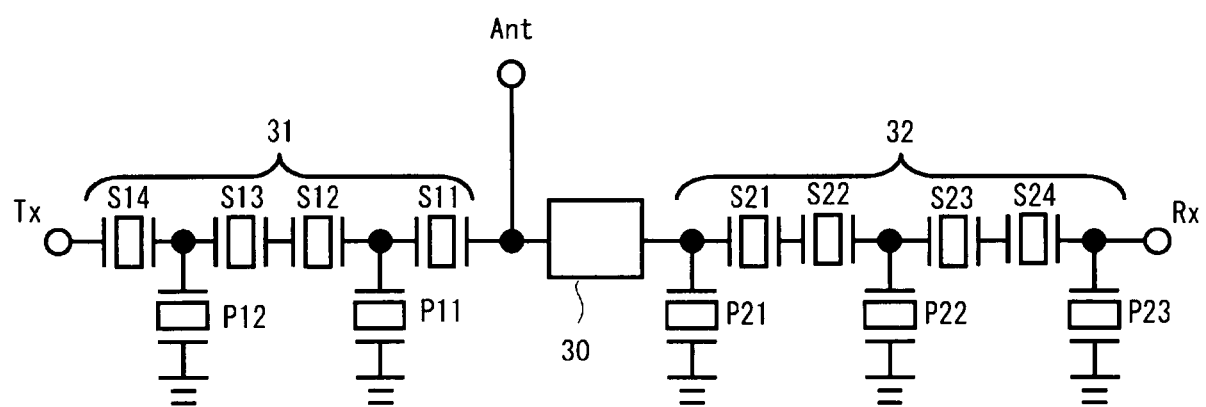
FIG. 26 is a circuit diagram of a duplexer in accordance with an eighth embodiment.

An eighth embodiment is an exemplary duplexer using a resonator configured by any of the first through fifth embodiments. Referring to FIG. 26, a transmission filter 31 is provided between a common terminal Ant and a transmission terminal Tx. A reception filter 32 is provided between the common terminal Ant and a reception terminal Rx. A matching circuit 30 is connected between the common terminal Ant and the reception filter 32. The transmission filter 31 is a ladder filter having series resonators S11 through S14 and parallel resonators P11 and P12. The reception filter 32 is a ladder filter having series resonators S21 through S24 and parallel resonators P21 through P23. The duplexer using the resonators configured by any of the first through fifth embodiments has a small insertion loss and a small TCF.

As described above in connection with the sixth through eighth embodiments, ladder filters and multimode filters may be configured using the acoustic wave devices of any of the first through fifth embodiments. Further, duplexers may be configured using filters using the acoustic wave devices of any of the first through fifth embodiments.

The present invention is not limited to the specifically described embodiments, but may include other embodiments and variations without departing from the scope of the present invention.

The present application is based on Japanese Patent Application No. 2006-248030 filed on Sep. 13, 2006, the entire disclosure of which is hereby incorporated by reference.

What is claimed is:

1. An acoustic wave device comprising:
a piezoelectric substrate;
comb electrodes formed above the piezoelectric substrate; and
a first dielectric film provided so as to cover the comb electrodes such that empty spaces contact fingers of the comb electrodes.

2. The acoustic wave device as claimed in claim 1 wherein the empty spaces are provided above the fingers of the comb electrodes, and
wherein the empty spaces contact the upper surface of the fingers of the comb electrodes and are formed between the comb electrodes and the first dielectric film.

3. The acoustic wave device as claimed in claim 1, wherein the empty spaces are located between two adjacent fingers of the comb electrodes, and wherein the empty spaces contact the side surface of the fingers of the comb electrodes.

4. The acoustic wave device as claimed in claim 3, wherein the empty spaces are located between two adjacent fingers of the comb electrodes so as to connect the two adjacent fingers.

5. The acoustic wave device as claimed in claim 1, wherein the empty spaces are located above the fingers of the comb electrodes and between two adjacent fingers of the comb electrodes,
wherein the empty spaces contact the upper surface and the side surface of the fingers of the comb electrodes, and
wherein the empty spaces are formed between the comb electrodes and the first dielectric film.

6. The acoustic wave device as claimed in claim 1 further comprising a second dielectric film provided between the piezoelectric substrate and the comb electrodes.

7. The acoustic wave device as claimed in claim 6, wherein the second dielectric film comprises a material identical to that included in the first dielectric film.

8. The acoustic wave device as claimed in claim 6, wherein the second dielectric film includes a material having a higher dielectric constant than the first dielectric film.

9. The acoustic wave device as claimed in claim 6, wherein the second dielectric film includes an aluminum oxide film.

10. The acoustic wave device as claimed in claim 6, wherein the first dielectric film contacts the piezoelectric film between adjacent fingers of the comb electrodes.

11. The acoustic wave device as claimed in claim 1, further comprising a third dielectric film provided on the first dielectric film.

12. The acoustic wave device as claimed in claim 11, wherein the third dielectric film has a propagation velocity of an acoustic wave that is greater than that of an acoustic wave propagated in the first dielectric film.

13. The acoustic wave device as claimed in claim 11, wherein the third dielectric film includes an aluminum oxide film.

14. The acoustic wave device as claimed in claim 1, wherein the piezoelectric substrate comprises one of lithium niobate and lithium tantalate.

15. The acoustic wave device as claimed in claim 1, wherein the comb electrodes comprise copper.

16. An acoustic wave device comprising:
a piezoelectric substrate;
comb electrodes formed above the piezoelectric substrate; and
a first dielectric film provided so as to cover the comb electrodes such that empty spaces are located above fingers of the comb electrodes and are formed in the first dielectric film,
wherein the first dielectric film is located between the fingers of the comb electrodes and the empty spaces.

17. A resonator comprising:
a piezoelectric substrate;
comb electrodes formed above the piezoelectric substrate;
reflection electrodes between which the comb electrodes are provided; and
a first dielectric film provided so as to cover the comb electrodes and the reflection electrodes such that empty spaces contact fingers of the comb electrodes and fingers of the reflection electrodes.

18. A resonator comprising:
a piezoelectric substrate;
comb electrodes formed above the piezoelectric substrate;
reflection electrodes between which the comb electrodes are provided; and a first dielectric film provided so as to cover the comb electrodes and the reflection electrodes such that empty spaces do not contact fingers of the comb electrodes and do not contact fingers of the reflection electrodes, wherein the empty spaces are formed in the first dielectric film, and wherein the first dielectric film is located between the fingers of the comb electrodes and the empty spaces, and between the reflection electrodes and the empty spaces.

19. A filter comprising multiple resonators including a resonator comprising:

a piezoelectric substrate;

comb electrodes formed above the piezoelectric substrate;

reflection electrodes between which the comb electrodes are provided; and a first dielectric film provided so as to cover the comb electrodes and the reflection electrodes such that empty spaces contact fingers of the comb electrodes and fingers of the reflection electrodes.

20. A filter comprising multiple resonators including a resonator comprising:

a piezoelectric substrate;

comb electrodes formed above the piezoelectric substrate;

reflection electrodes between which the comb electrodes are provided; and a first dielectric film provided so as to cover the comb electrodes and the reflection electrodes such that empty spaces do not contact fingers of the comb electrodes and do not contact fingers of the reflection electrodes, wherein the empty spaces are formed in the first dielectric film, and wherein the first dielectric film is located between the fingers of the comb electrodes and the empty spaces, and between the reflection electrodes and the empty spaces.

* * * * *